United States Patent
Wang et al.

(10) Patent No.: US 10,026,375 B2
(45) Date of Patent: Jul. 17, 2018

(54) OUTPUT AMPLIFIER OF A SOURCE DRIVER AND CONTROL METHOD THEREOF

(71) Applicant: HIMAX TECHNOLOGIES LIMITED, Tainan (TW)

(72) Inventors: Jia-Hui Wang, Tainan (TW); Chuan-Chien Hsu, Tainan (TW); Hung-Yu Huang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 53 days.

(21) Appl. No.: 15/356,679

(22) Filed: Nov. 21, 2016

(65) Prior Publication Data

US 2017/0287430 A1 Oct. 5, 2017

Related U.S. Application Data

(60) Provisional application No. 62/314,421, filed on Mar. 29, 2016.

(51) Int. Cl.
*G09G 3/36* (2006.01)
*H03K 17/687* (2006.01)

(52) U.S. Cl.
CPC ......... *G09G 3/3688* (2013.01); *G09G 3/3614* (2013.01); *H03K 17/6872* (2013.01); *G09G 2310/027* (2013.01); *G09G 2310/0291* (2013.01); *G09G 2330/021* (2013.01)

(58) Field of Classification Search
CPC ............... G09G 3/3688; G09G 3/3614; G09G 2330/021; G09G 2310/027; G09G 2310/0291; H03K 17/6872
See application file for complete search history.

(56) References Cited

U.S. PATENT DOCUMENTS

| | | | | |
|---|---|---|---|---|
| 6,970,152 B1* | 11/2005 | Bell | ...................... | G09G 3/3688 330/123 |
| 7,123,231 B2* | 10/2006 | Honda | .................. | G09G 3/3685 345/96 |
| 9,030,453 B2* | 5/2015 | Cho | ...................... | G09G 3/3688 345/209 |
| 2008/0211835 A1* | 9/2008 | Enjou | .................. | G09G 3/3685 345/690 |
| 2012/0161661 A1* | 6/2012 | Cho | ...................... | G09G 3/3696 315/241 R |

\* cited by examiner

*Primary Examiner* — Mihir K Rayan
(74) *Attorney, Agent, or Firm* — CKC & Partners Co., Ltd.

(57) ABSTRACT

An output amplifier of a source driver and a control method thereof are provided. The output amplifier includes a first switch circuit, a second switch circuit, a third switch circuit, a first input stage circuit, a second input stage circuit, a first active load circuit, a second active load circuit, a first positive output stage circuit, a first negative output stage circuit, a second positive output stage circuit and a second negative output stage circuit. In a first display stage of the control method, the first switch circuit outputs a positive reference signal through a first output terminal and outputs a negative reference signal through a second output terminal. In a second display stage of the control method, the signals outputted by the first output terminal and the second output terminal are exchanged.

20 Claims, 25 Drawing Sheets

400

```
┌─────────────────────────────────────────────┐
│ The first switch circuit is configured to output a │
│ positive reference signal through the first output │──411
│ terminal and to output a negative reference signal │
│     through the second output terminal.     │
└─────────────────────────────────────────────┘
                      ↓
┌─────────────────────────────────────────────┐
│   The positive reference signal and the negative   │
│  reference signal are received respectively to obtain │
│   a first received reference signal and a second   │──412
│   received reference signal by using the first input │
│    stage circuit and the second input stage circuit.  │
└─────────────────────────────────────────────┘
                      ↓
┌─────────────────────────────────────────────┐
│  The first divided reference signal and the second divided │
│  reference signal are transmitted by using the first active load │──413
│       circuit and the second active load circuit.       │
└─────────────────────────────────────────────┘
         ↓ 415                           414 ↓
┌──────────────────┐              ┌──────────────────┐
│  The third switch │              │  The second switch │
│ circuit is configured│              │     circuit is     │
│ to output the second│              │   configured to    │
│ received reference │              │  output the first  │
│  signal through the │              │ received reference │
│    second output   │              │ signal through the │
│      terminal      │              │    first output    │
│                    │              │      terminal      │
└──────────────────┘              └──────────────────┘
```

```
┌─────────────────────────────────────────────┐
│ The first switch circuit is configured to output the │
│ positive reference signal through the second output │──416
│ terminal and to output the negative reference signal │
│      through the first output terminal.             │
└─────────────────────────────────────────────┘
                        │
                        ▼
┌─────────────────────────────────────────────┐
│     The positive reference signal and the negative  │
│   reference signal are d are received respectively to│
│   obtain a first received reference signal and a second│──417
│   received reference signal by using the first input │
│    stage circuit and the second input stage circuit. │
└─────────────────────────────────────────────┘
                        │
                        ▼
┌─────────────────────────────────────────────┐
│ The first divided reference signal and the second divided│
│  reference signal are transmitted by using the first active│──418
│       load circuit and the second active load circuit.    │
└─────────────────────────────────────────────┘
```

420   419

| The third switch circuit is configured to output the second received reference signal through the first output terminal | The second switch circuit is configured to output the first received reference signal through the second output terminal |

FIG. 4b

OUTPUT AMPLIFIER OF A SOURCE DRIVER AND CONTROL METHOD THEREOF

RELATED APPLICATIONS

This application claims the benefit of the Provisional Application Ser. No. 62/314,421, filed Mar. 29, 2016. The entire disclosures of all the above applications are hereby incorporated by reference herein.

BACKGROUND

Field of Invention

The present invention relates to an output amplifier of a source driver and a control method thereof. More particularly, the present invention relates to an output amplifier of a source driver used for a liquid crystal display (LCD) and a control method thereof.

Description of Related Art

With progress in the flat panel display (FPD) industry, there has been a tendency for consumers to shift from conventional cathode-ray tube (CRT) displays to liquid crystal displays (LCD) because LCDs have smaller volumes, lighter weights, lower radiation and lower power consumption. Nowadays, LCD panels are commercially used in consumer products, such as personal digital assistants (PDA), mobile phones, cameras, laptops and televisions.

A conventional LCD panel includes a timing controller, source drivers, gate drivers and a pixel matrix. The source drivers are used to provide pixel data signals to the pixel matrix. To avoid polarization of liquid crystal molecules of the pixel matrix, the source drivers are also used to conduct polarity inversion to apply voltages having opposite polarities to the liquid crystal molecules of the pixel matrix, in which polarity inversion technologies includes dot inversion, line inversion and column inversion. However, an output amplifier of the conventional source driver consumes too much power, and thus there is a demand for an output amplifier of a source driver consuming less power.

SUMMARY

The invention provides an output amplifier of a source driver and a control method thereof to decrease power consumption of the source driver.

According to an embodiment of the present invention, the output amplifier of the source driver includes a first switch circuit, a second switch circuit, a third switch circuit, a first input stage circuit, a second input stage circuit, a first active load circuit, a second active load circuit, a first positive output stage circuit, a first negative output stage circuit, a second positive output stage circuit and a second negative output stage circuit, wherein the first switch circuit receives a positive reference signal and a negative reference signal of the source driver.

The first switch circuit is configured to receive a positive reference signal and a negative reference signal of the source driver, wherein the first switch circuit has a first output terminal and a second output terminal configured to selectively output the positive reference signal and the negative reference signal. The first input stage circuit is electrically connected to the first output terminal of the first switch circuit to receive one of the positive reference signal and the negative reference signal and to output a first received reference signal accordingly. The second input stage circuit is electrically connected to the second output terminal of the first switch circuit to receive the other one of the positive reference signal and the negative reference signal and to output a second received reference signal accordingly. The first active load circuit is electrically connected to the first input stage circuit to receive the first received reference signal. The second switch circuit is electrically connected to the first active load circuit to receive the first received reference signal, in which the second switch circuit has a first output terminal and a second output terminal, and the second switch circuit is configured to select one of the first output terminal and the second output terminal to output the first received reference signal. The first positive output stage circuit is electrically connected to the first output terminal of the second switch circuit. The first negative output stage circuit is electrically connected to the second output terminal of the second switch circuit.

The second active load circuit is electrically connected to the second input stage circuit to receive the second received reference signal. The third switch circuit is electrically connected to the second active load circuit to receive the second received reference signal, in which the third switch circuit has a first output terminal and a second output terminal, and the third switch circuit is configured to select one of the first output terminal and the second output terminal to output the second received reference signal. The second positive output stage circuit is electrically connected to the first output terminal of the third switch circuit. The second negative output stage circuit is electrically connected to the second output terminal of the third switch circuit.

An output terminal of the first positive output stage circuit and an output terminal of the first negative output stage circuit are electrically connected together, and an output terminal of the second positive output stage circuit and an output terminal of the second negative output stage circuit are electrically connected together, and a power voltage source and a half-power voltage source are electrically connected to the first positive output stage and the second output stage to provide a power voltage and a ground reference voltage of the first positive output stage and the second positive output stage, and a ground voltage source and the half-power voltage source are electrically connected to the first negative output stage and the negative output stage to provide a ground reference voltage and a power voltage of the first negative output stage and the second negative output stage, and a value of the voltage of the half-power voltage source is between a value of the voltage of the power voltage source and a value of the voltage of the ground voltage source.

According to another embodiment of the present invention, the output amplifier of the source driver includes a first switch circuit, a third switch circuit, a fourth switch circuit, a first input stage circuit, a second input stage circuit, a first active load circuit, a second active load circuit, a first positive output stage circuit, a first negative output stage circuit, a second positive output stage circuit and a second negative output stage circuit, wherein the first switch circuit receives a positive reference signal and a negative reference signal of the source driver. The first switch circuit is configured to receive a positive reference signal and a negative reference signal of the source driver, wherein the first switch circuit has a first output terminal and a second output terminal configured to selectively output the positive reference signal and the negative reference signal. The first input stage circuit is electrically connected to the first output terminal of the first switch circuit to receive one of the positive reference signal and the negative reference signal and to output a first received reference signal accordingly. The second input stage circuit is electrically connected to the second output terminal of the first switch circuit to receive the other one of the positive reference signal and the negative reference signal and to output a second received reference signal accordingly.

The first active load circuit is configured to receive one of the first received reference signal and the second received reference signal, and the second active load circuit is configured to receive the other one of the first received reference signal and the second received reference signal. The third switch circuit is electrically connected to the first active load circuit, wherein the third switch circuit has a first output terminal and a second output terminal, and the third switch circuit is configured to select one of the first output terminal and the second output terminal to output one of the first received reference signal and the second received reference signal. The fourth switch circuit is electrically connected to the second active load circuit, in which the fourth switch circuit has a first output terminal and a second output terminal, and the fourth switch circuit is configured to select one of the first output terminal and the second output terminal to output the other one of the first received reference signal and the second received reference signal. The first positive output stage circuit is electrically connected to the first output terminal of the third switch circuit. The second positive output stage circuit is electrically connected to the second output terminal of the third switch circuit. The first negative output stage circuit is electrically connected to the first output terminal of the fourth switch circuit. The second negative output stage circuit is electrically connected to the second output terminal of the fourth switch circuit.

An output terminal of the first positive output stage circuit and an output terminal of the first negative output stage circuit are electrically connected together, and an output terminal of the second positive output stage circuit and an output terminal of the second negative output stage circuit are electrically connected together, and a power voltage source and a half-power voltage source are electrically connected to the first positive output stage and the second output stage to provide a power voltage and a ground reference voltage of the first positive output stage and the second positive output stage, and a ground voltage source and the half-power voltage source are electrically connected to the first negative output stage and the negative output stage to provide a ground reference voltage and a power voltage of the first negative output stage and the second negative output stage, and a value of the voltage of the half-power voltage source is between a value of the voltage of the power voltage source and a value of the voltage of the ground voltage source.

According to further another embodiment of the present invention, the control method of the output amplifier of the source driver includes a first display stage and a second display stage. In the first display stage, at first, the first switch circuit is set to output the positive reference signal through a first output terminal and to output the negative reference signal through a second output terminal. Then, the positive reference signal and the negative reference signal are respectively received by using the first input stage circuit and the second input stage circuit to obtain a first received reference signal and a second received reference signal. Thereafter, the first received reference signal and the second received reference signal are respectively received by the first active load circuit and the second active load circuit. Then, the second switch circuit and the third switch circuit are switched to respectively receive the first received reference signal and the second received reference signal and to selectively output the received reference signal and the second received reference signal to the first positive output stage circuit, the first negative output stage circuit, the second positive output stage circuit and the second negative output stage circuit.

In the second display stage, at first, the first switch circuit is switched to output the positive reference signal through the second output terminal and to output the negative reference signal through the first output terminal. Then, the positive reference signal and the negative reference signal are respectively received by using the first input stage circuit and the second input stage circuit to obtain a first received reference signal and a second received reference signal. Thereafter, the first received reference signal and the second received reference signal are respectively received by the first active load circuit and the second active load circuit. Then, the second switch circuit and the third switch circuit are switched to respectively receive the first received reference signal and the second received reference signal and to selectively output the received reference signal and the second received reference signal to the first positive output stage circuit, the first negative output stage circuit, the second positive output stage circuit and the second negative output stage circuit.

BRIEF DESCRIPTION OF THE DRAWINGS

The invention can be more fully understood by reading the following detailed description of the embodiment, with reference made to the accompanying drawings as follows:

FIGS. 4a-4b are schematic diagrams showing a flow chart of a control method of the source driver in accordance with an embodiment of the present invention;

DETAILED DESCRIPTION

Figure 1:
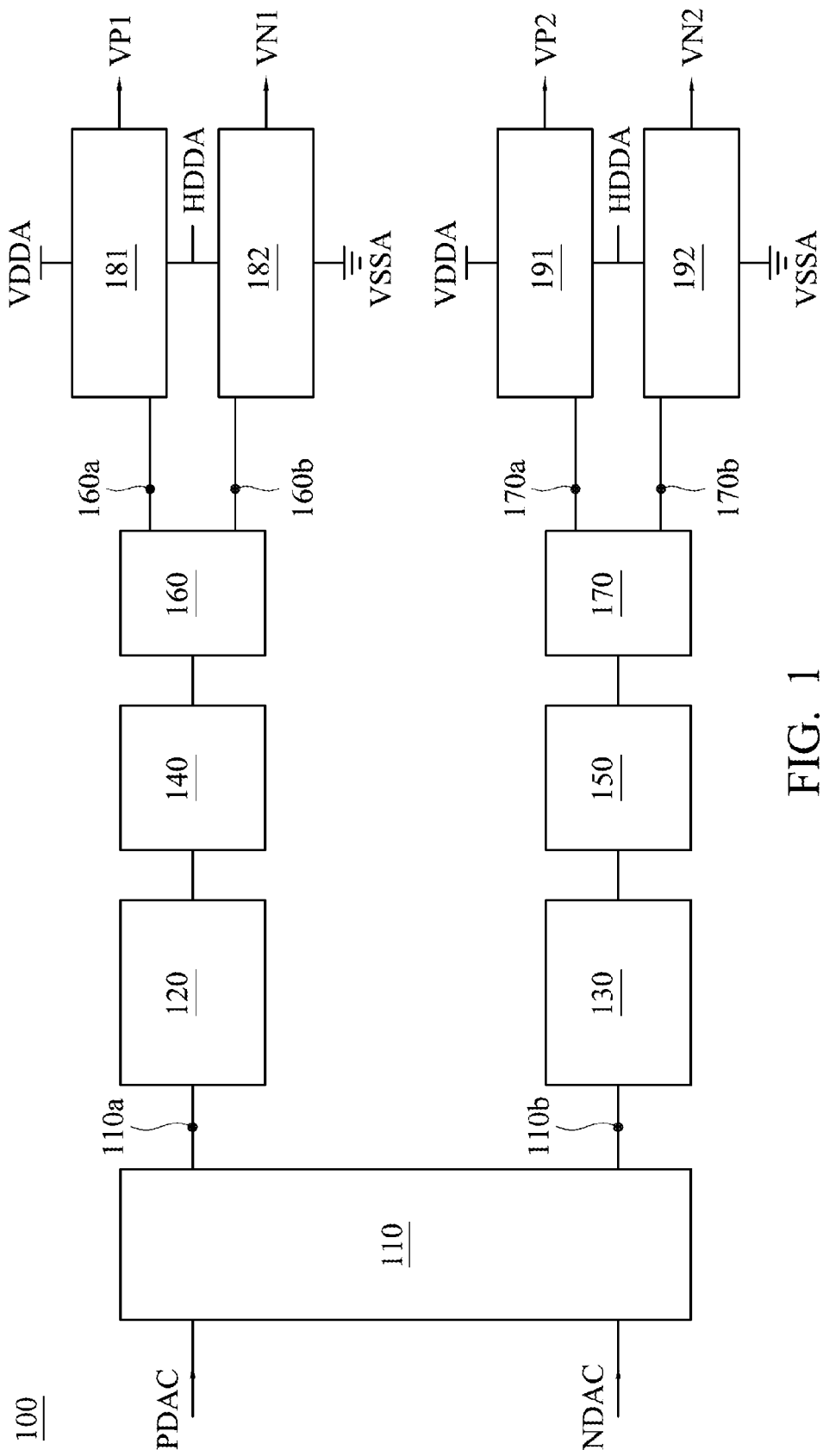
FIG. 1 is a functional block diagram showing a circuit structure of an output amplifier of a source driver in accordance with an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, FIG. 1 is a functional block diagram showing a circuit structure of an output amplifier 100 of a source driver in accordance with an embodiment of the present invention. The output amplifier 100 includes a first switch circuit 110, a first input stage circuit 120, a second input stage circuit 130, a first active load circuit 140, a second active load circuit 150, a second switch circuit 160, a third switch circuit 170, a first positive output stage circuit 181, a first negative output stage circuit 182, a second positive output stage circuit 191 and a second negative output stage circuit 192.

The first switch circuit 110 is configured to receive a positive reference signal PDAC and a negative reference signal NDAC from a digital-to-analog converter. The positive reference signal PDAC and the negative reference signal NDAC are provided for performing polarity inversion. The first switch circuit 110 has a first output terminal 110a and a second output terminal 110b configured to selectively output the positive reference signal PDAC and the negative reference signal NDAC. In this embodiment, the first switch circuit 110 is a multiplexer, but embodiments of the present invention are not limited thereto.

The first input stage circuit 120 is electrically connected to the first output terminal 110a of the first switch circuit 110 to receive one of the positive reference signal PDAC and the negative reference signal NDAC and to output a first received reference signal accordingly. The second input stage circuit 130 is electrically connected to the second output terminal 110b of the first switch circuit 110 to receive the other one of the positive reference signal PDAC and the negative reference signal NDAC and to output a second received reference signal accordingly. In this embodiment, each of the first input stage circuit 120 and the second input stage circuit 130 includes a differential pair used to overcome zero drift problems, but embodiments of the present invention are not limited thereto.

The first active load circuit 140 is electrically connected to the first input stage circuit 120 to receive the first received reference signal, and the second active load circuit 150 is electrically connected to the second input stage circuit 130 to receive the second received reference signal. In this embodiment, each of the first active load circuit 140 and the second active load circuit 150 includes a current mirror circuit, but embodiments of the present invention are not limited thereto.

The second switch circuit 160 is electrically connected to the first active load circuit to receive the first received reference signal. The second switch circuit 160 has a first output terminal 160a and a second output terminal 160b, and the second switch circuit 160 is configured to select one of the first output terminal 160a and the second output terminal 160b to output the first received reference signal. Similarly, the third switch circuit 170 is electrically connected to the second active load circuit 150 to receive the second received reference signal. The third switch circuit 170 has a first output terminal 170a and a second output terminal 170b, and the third switch circuit 170 is configured to select one of the first output terminal 170a and the second output terminal 170b to output the second received reference signal. In this embodiment, the second switch circuit 160 and the third switch circuit 170 are multiplexers, but embodiments are not limited thereto.

The first positive output stage circuit 181 is electrically connected to the first output terminal 160a of the second switch circuit 160, and the first negative output stage circuit 182 is electrically connected to the second output terminal 160b of the second switch circuit 160. The first positive output stage circuit 181 and the first negative output stage circuit 182 are configured to output voltage signals VP1 and VN1 used for polarity inversion. In this embodiment, an output terminal of the first positive output stage circuit 181 and an output terminal of the first negative output stage circuit 182 are electrically connected together. Further, a power voltage source and a half-power voltage source provide a voltage VDDA and a voltage HDDA to be a power voltage and a ground reference voltage of the first positive output stage 181. Similarly, the half-power voltage source and a ground voltage source provide the voltage HDDA and a voltage VSSA to be a power voltage and a ground reference voltage of the first negative output stage 182. It is noted that a value of the voltage HDDA is between the value of the voltage HDDA and the voltage VSSA, and the value of the voltage HDDA is bigger than that of the voltage VSSA. In this embodiment, the value of the voltage HDDA is substantially equal to a half of a difference between the value of voltage VSSA and the value of the voltage HDDA and has a tolerance of ±10%.

The second positive output stage circuit 191 is electrically connected to the first output terminal 170a of the third switch circuit 170, and the second negative output stage circuit 192 is electrically connected to the second output terminal 170b of the third switch circuit 170. The second positive output stage circuit 191 and the second negative output stage circuit 192 are configured to output voltage signals VP2 and VN2 used for polarity inversion. In this embodiment, an output terminal of the second positive output stage circuit 191 and an output terminal of the second negative output stage circuit 192 are electrically connected together. Further, the power voltage source and the half-power voltage source provide the voltage VDDA and the voltage HDDA to be a power voltage and a ground reference voltage of the second positive output stage 191. Similarly, the half-power voltage source and the ground voltage source provide the voltage HDDA and the voltage VSSA to be a power voltage and a ground reference voltage of the second negative output stage 192.

In addition, each of the first positive output stage circuit 181, the second positive output stage circuit 191, the first negative output stage circuit 182 and the second negative output stage circuit 192 includes a complementary transistor pair, and the complementary transistor pair includes a N-type field-effect transistor and a P-type field-effect transistor. Further, the voltage signals VP1 and VP2 represent positive signals used for polarity inversion, and the voltage signal VN1 and VN2 represent negative signals used for polarity inversion.

Referring to FIG. 2, FIG. 3 and FIGS. 4a-4b, FIG. 2 and FIG. 3 are schematic diagrams showing signal paths of the source driver 100, and FIGS. 4a-4b are schematic diagrams showing a flow chart of a control method 400 of the source driver 100. The control method 400 includes a first display stage and a second display stage performed alternatively. The signal paths in FIG. 2 and steps 411-415 in FIG. 4a correspond to the first display stage, and the signal paths in FIG. 3 and steps 416-420 in FIG. 4b correspond to the second display stage.

Figure 2:
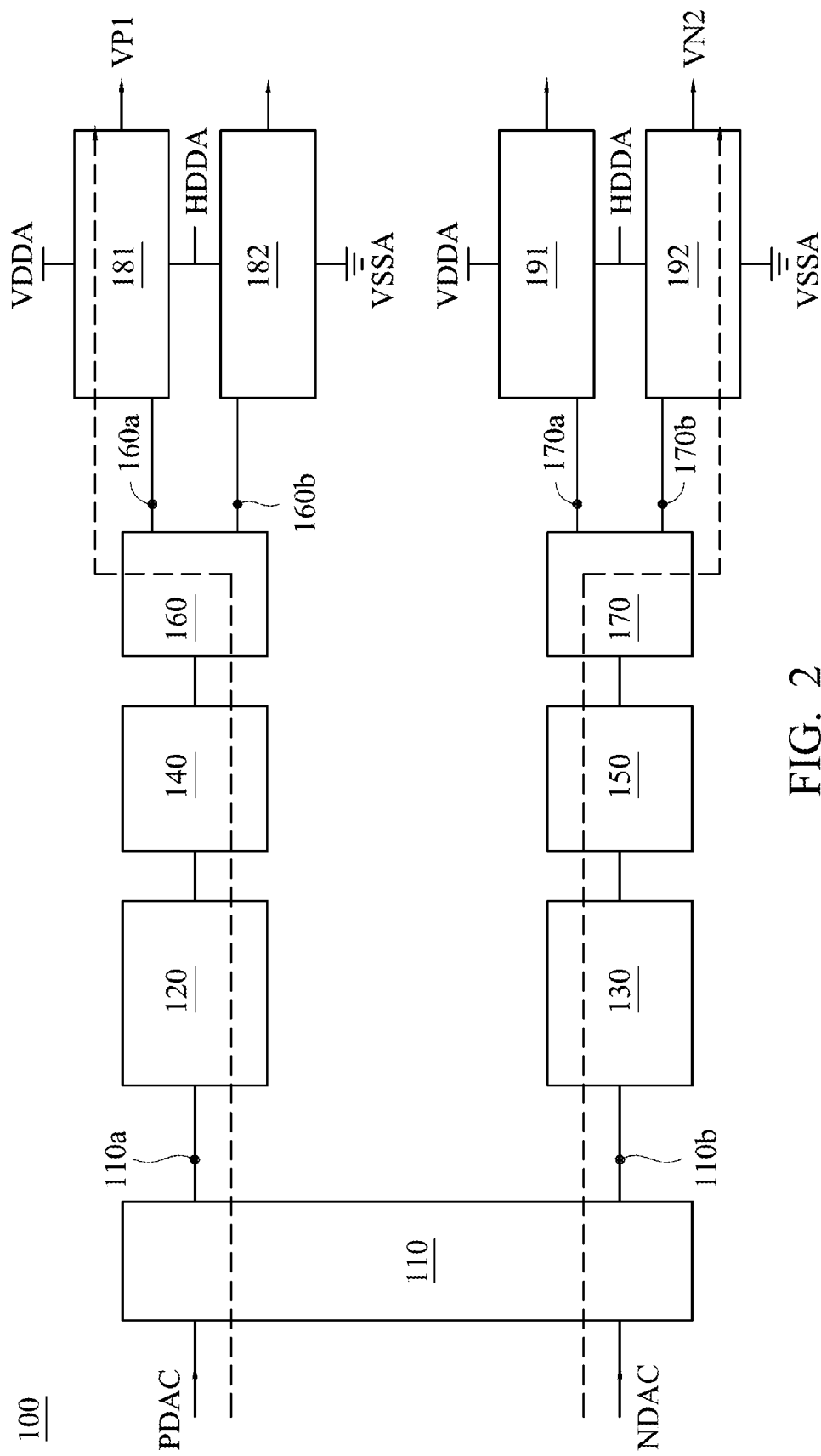
FIG. 2 and FIG. 3 are schematic diagrams showing signal paths of the source driver in accordance with an embodiment of the present invention.

As shown in FIG. 2 and FIG. 4a, in the first display stage, at first, the step 411 is performed. In the step 411, the first switch circuit 110 is configured to output the positive reference signal PDAC through the first output terminal 110a and to output the negative reference signal NDAC through the second output terminal 110b. Then, the step 412 is performed. In the step 412, the positive reference signal PDAC and the negative reference signal NDAC are respectively received by the first input stage circuit 120 and the second input stage circuit 130. For example, the positive reference signal PDAC is received by the first input stage circuit 120, and the first input stage circuit 120 outputs a first received reference signal accordingly. For another example, the negative reference signal NDAC is received by the second input stage circuit 130, and the second input stage circuit 130 outputs a second received reference signal accordingly.

Thereafter, the step 413 is performed. In the step 413, the first received reference signal and the second received reference signal are respectively received by the first active load circuit 140 and the second active load circuit 150. For example, the first active load circuit 140 receives the first received reference signal from the first input stage circuit 120, and the second active load circuit 150 receives the second received reference signal from the second input stage circuit 130.

Then, the step 414 and the step 415 are performed. In the step 414, the second switch circuit 160 is configured to receive the first received reference signal and to output the first received reference signal through the first output terminal 160a, thereby enabling the first positive output stage circuit 181 to output the voltage signal VP1. In the step 415, the third switch circuit 170 is configured to receive the second received reference signal and to output the second received reference signal through the second output terminal 170b, thereby enabling the second negative output stage circuit 192 to output the voltage signal VN2.

Figure 3:
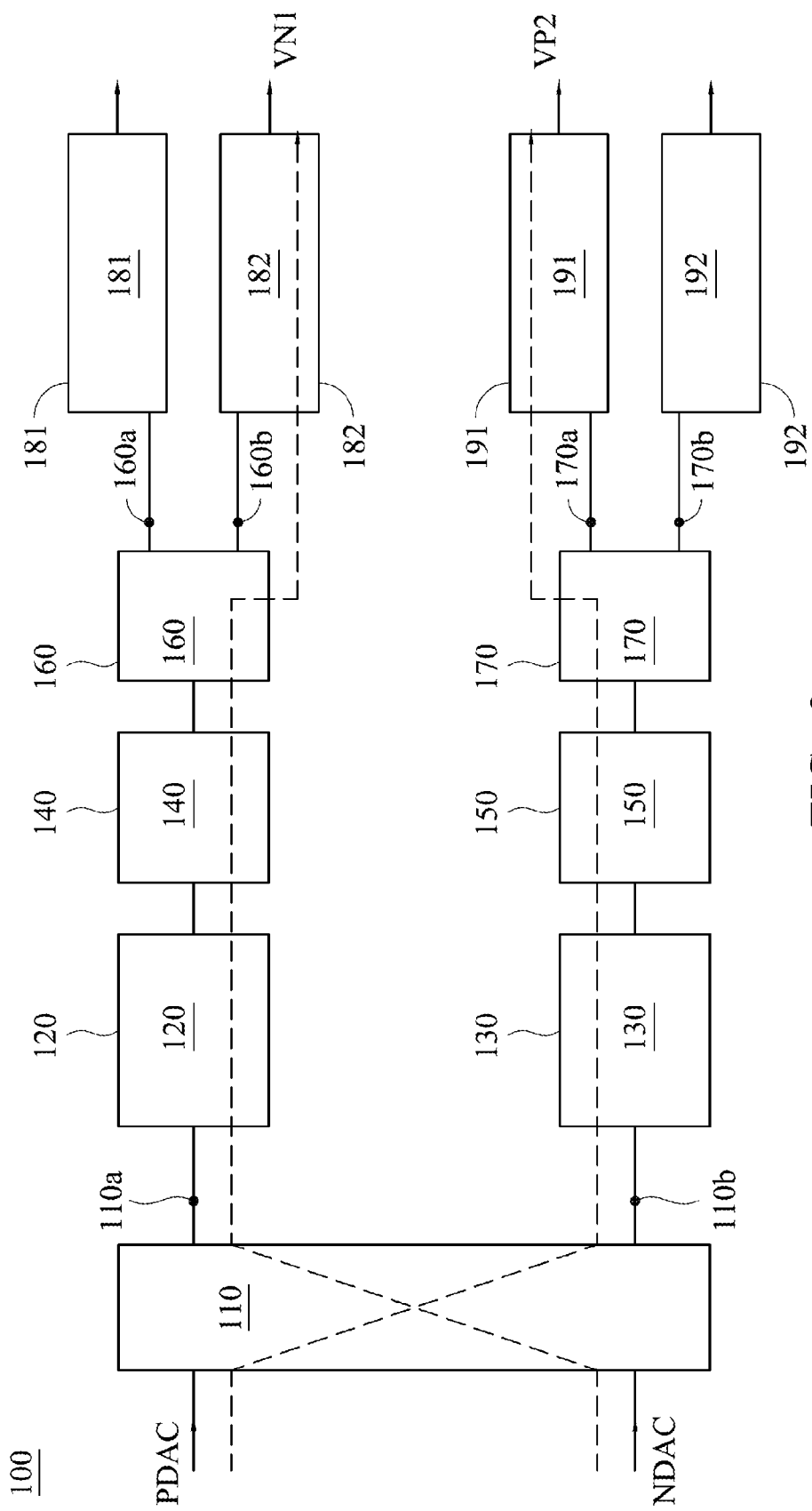

As shown in FIG. 3 and FIG. 4b, in the second display stage, at first, the step 416 is performed. In the step 416, the first switch circuit 110 is switched to output the positive reference signal PDAC through the second output terminal 110b and to output the negative reference signal NDAC through the first output terminal 110a. Then, the step 417 is performed. In the step 417, the positive reference signal PDAC and the negative reference signal NDAC are respectively received by the first input stage circuit 120 and the second input stage circuit 130. For example, the negative reference signal NDAC is received by the first input stage circuit 120 and the first input stage circuit 120 outputs a first received reference signal accordingly. For another example, the positive reference signal PDAC is received by the second input stage circuit 130 and the second input stage circuit 130 outputs a second received reference signal accordingly.

Thereafter, the step 418 is performed. In the step 418, the first received reference signal and the second received reference signal are respectively received by the first active load circuit 140 and the second active load circuit 150. For example, the first active load circuit 140 receives the first received reference signal from the first input stage circuit 120, and the second active load circuit 150 receives the second received reference signal from the second input stage circuit 130.

Then, the step 419 and the step 420 are performed. In the step 419, the second switch circuit 160 is configured to receive the first received reference signal and to output the first received reference signal through the second output terminal 160b, thereby enabling the first negative output stage circuit 182 to output the voltage signal VN1. In the step 420, the third switch circuit 170 is configured to receive the second received reference signal and to output the second received reference signal through the first output terminal 170a, thereby enabling the second positive output stage circuit 191 to output the voltage signal VP2.

It can be understood that the output amplifier 100 of this embodiment does not include a switch circuit disposed after the first positive output stage circuit 181, the second positive output stage circuit 191, the first negative output stage circuit 182 and the second negative output stage circuit 192, to receive(switch) the output signals of the first positive output stage circuit 181, the second positive output stage circuit 191, the first negative output stage circuit 182 and the second negative output stage circuit 192. Therefore, the output amplifier 100 has decreased power consumption. In other words, when being transmitted to a panel, the signals VP1, VN1, VP2 and VN2 do not pass through any multiplexer(switch) to result in additional power consumption.

Figure 5:
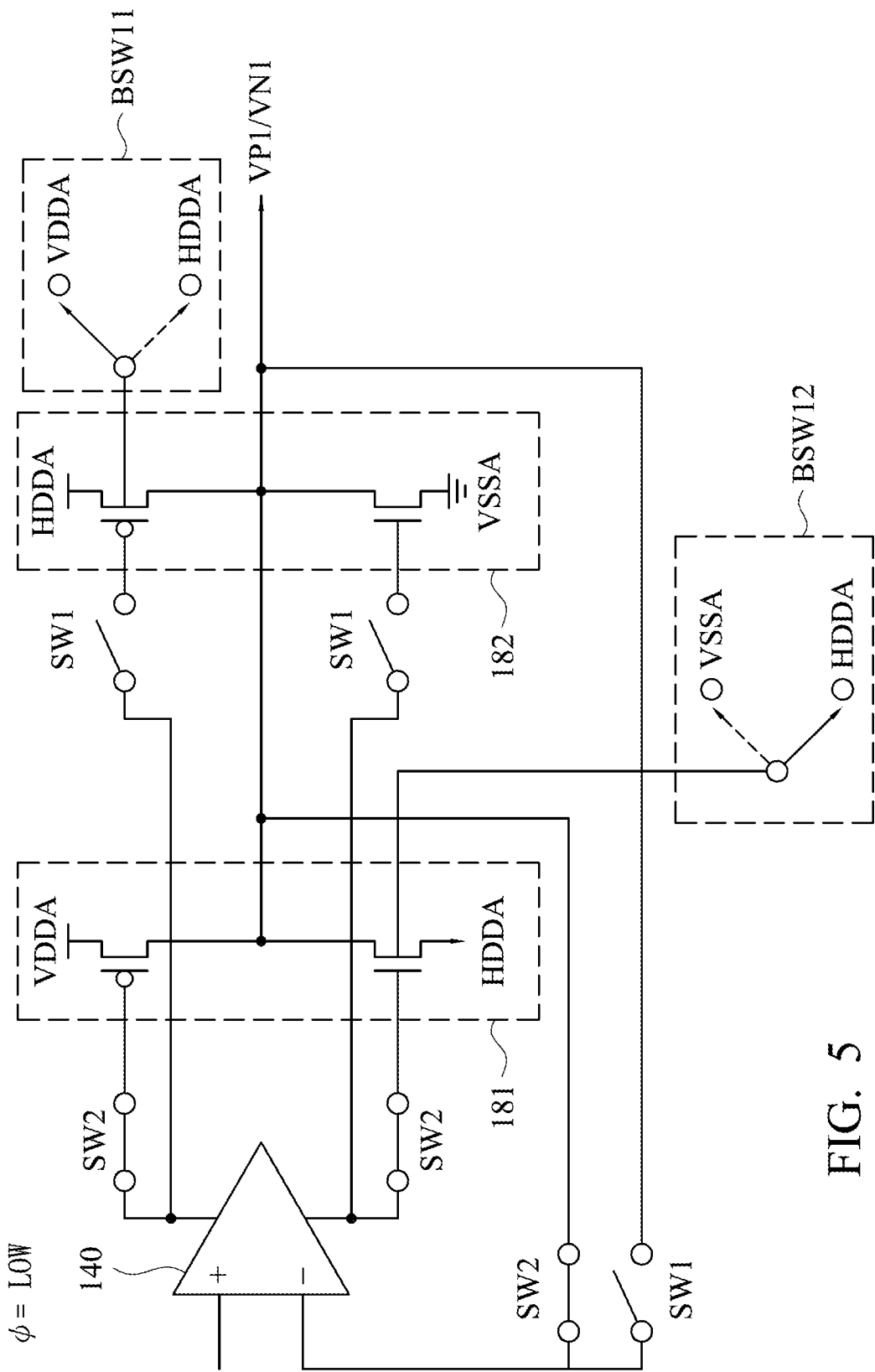
FIG. 5 and FIG. 6 are circuit diagrams showing a partial structure of an output amplifier of a source driver in accordance with an embodiment of the present invention.
Figure 6:
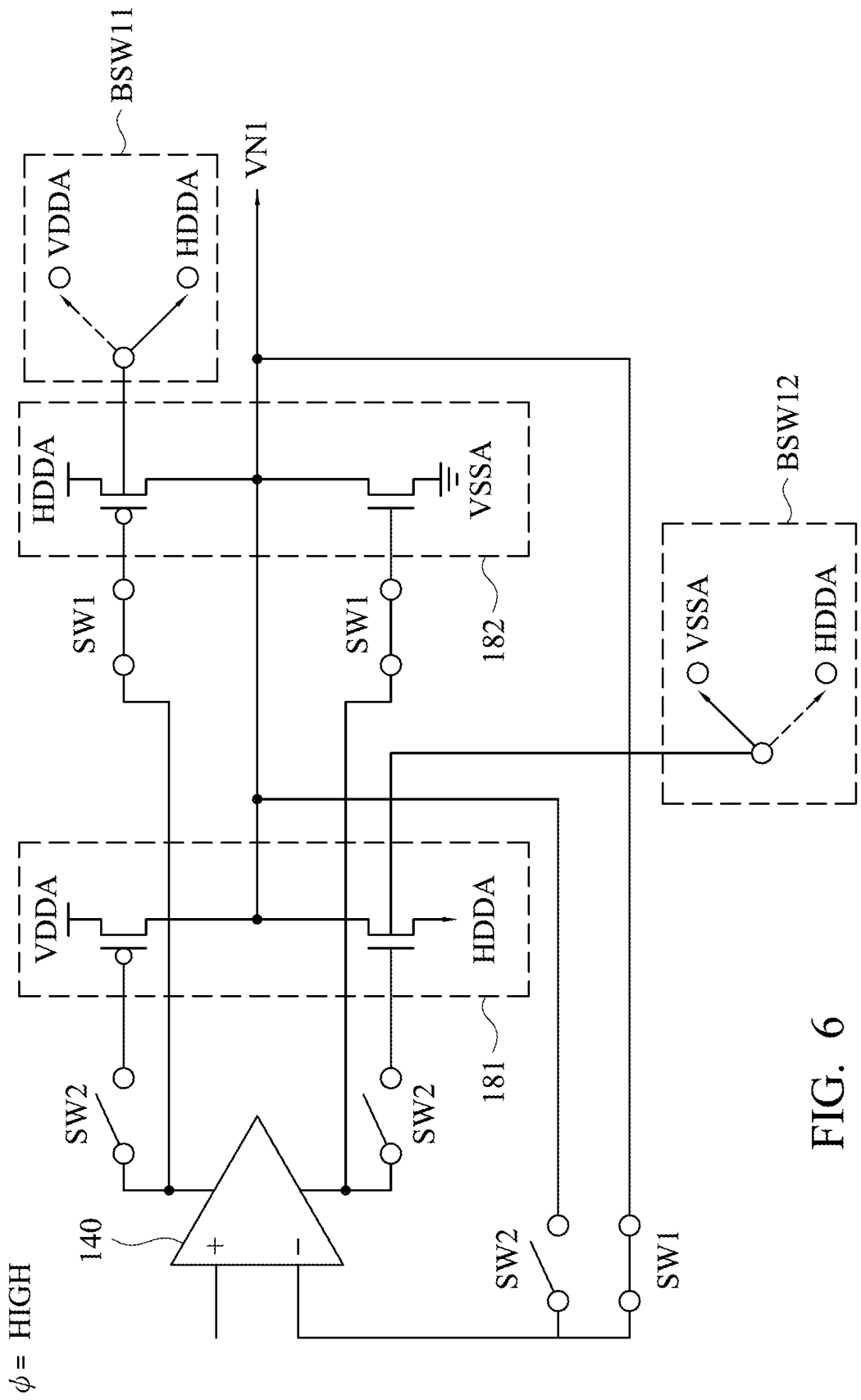

Referring FIG. 5 and FIG. 6, FIG. 5 and FIG. 6 are circuit diagrams showing a partial structure of an output amplifier of a source driver in accordance with an embodiment of the present invention. The output amplifier of this embodiment is similar to the output amplifier 100. However, the output amplifier of this embodiment further includes bulk switch circuits such as a first bulk switch circuit BSW11, a second bulk switch circuit BSW12, a third bulk switch circuit (not illustrated), a fourth bulk switch circuit (not illustrated) to solve a problem of PN junction forward, in which the first bulk switch circuit BSW11 and a second bulk switch circuit BSW12 are adapted for the first positive output stage circuit 181 and the first negative output stage circuit 182, and the third bulk switch circuit and the fourth bulk switch circuit are adapted for the second positive output stage circuit 191 and the second negative output stage circuit 192.

Since an output terminal of the first positive output stage circuit 181 and an output terminal of the first negative output stage circuit 182 are electrically connected together, the problem of PN junction forward occurs when one of the first positive output stage circuit 181 and the first negative output stage circuit 182 receives the first received reference signal from the first active load circuit 140. Similarly, since an output terminal of the second positive output stage circuit 191 and an output terminal of the second negative output stage circuit 192 are electrically connected together, the problem of PN junction forward occurs when one of the second positive output stage circuit 191 and the second negative output stage circuit 192 receives the second received reference signal from the second active load circuit 150.

As shown in FIG. 5, when a polarity signal t of a timing controller is logic low, switches SW1 of the second switch circuit 160 are turned off (open) and switches SW2 of the second switch circuit 160 are turned on (shorted). In this case, the first positive output stage 181 is operated to provide the voltage signal VP1 according to the first received reference signal from the first active load circuit 140. The voltage signal VP1 is applied to the output terminal of the first negative output stage 182. At this time, if the voltage HDDA is still applied to the body of the PMOS of the first negative output stage 182, a PN junction of the PMOS of the first negative output stage 182 is forward biased since the voltage signal VP1 is greater than the voltage HDDA. Therefore, an undesired current path is formed due to the problem of PN junction forward.

To solve the problem of PN junction forward with respect to the PMOS of the first negative output stage 182, the first bulk switch circuit BSW11 is switched to electrically connect the power voltage source having the voltage VDDA with the bulk of the PMOS of the first negative output stage circuit 182. Because the voltage signal VP1 from the first positive output stage 181 is smaller than the voltage VDDA, the PN junction of the PMOS of the first negative output stage 182 is reverse biased, and thus the problem of PN junction forward with respect to the PMOS of the first negative output stage 182 is solved.

As shown in FIG. 6, when the polarity signal Φ of the timing controller is logic high, the switches SW1 are turned on (shorted) and the switches SW2 are turned off (open). In this case, the first negative output stage circuit 182 is operated to provide the voltage signal VN1 according to the first received reference signal from the first active load circuit 140. The voltage signal VN1 is applied to the output terminal of the first positive output stage 181. At this time, if the voltage HDDA is still applied to the body of the NMOS of the first positive output stage circuit 181, a PN junction of the NMOS of the first positive output stage circuit 181 is forward biased since the voltage signal VN1 is smaller than the voltage HDDA. Therefore, an undesired current path is formed due to the problem of PN junction forward.

To solve the problem of PN junction forward with respect to the NMOS of the first positive output stage circuit 181, the second bulk switch circuit BSW12 is switched to electrically connect the ground voltage source having the voltage VSSA with the bulk of the NMOS of the first positive output stage circuit 181. Because the voltage signal VN1 from the first negative output stage circuit 182 is greater than the voltage VSSA, the PN junction of the NMOS of the first positive output stage circuit 181 is reverse biased, and thus the problem of PN junction forward with respect to the NMOS of the first positive output stage circuit 181 is solved.

It is noted that structures of the second positive output stage circuit 191 and the second negative output stage circuit 192 are the same as structures of the first positive output stage circuit 181 and the first negative output stage circuit 182, and thus the structures of the second positive output stage circuit 191 and the second negative output stage circuit 192 are not repeated herein.

In addition, the NMOSs of the second positive output stage circuit 191 and the second negative output stage circuit 192 have the problem of PN junction forward, too. Since the structures of the second positive output stage circuit 191 and the second negative output stage circuit 192 are the same as the structures of the first positive output stage circuit 181 and the first negative output stage circuit 182, the functions and structures of the third bulk switch circuit and the forth bulk switch circuit adapted for the second positive output stage circuit 191 and the second negative output stage circuit 192 are similar to the functions and structures of the first bulk switch circuit BSW11 and the second bulk switch circuit BSW12 and not repeated herein.

In this embodiment, when an output stage circuit is selected to output a voltage signal, a bulk switch circuit corresponding thereto is switched to connect with the half-power voltage source having the voltage HDDA. In contrast, when an output stage circuit is not selected to output a voltage signal, a bulk switch circuit corresponding thereto is switched to connect with the power voltage source having the voltage VDDA or the ground voltage source having the voltage VSSA. Therefore, the problem of PN junction forward is solved.

Figure 7:
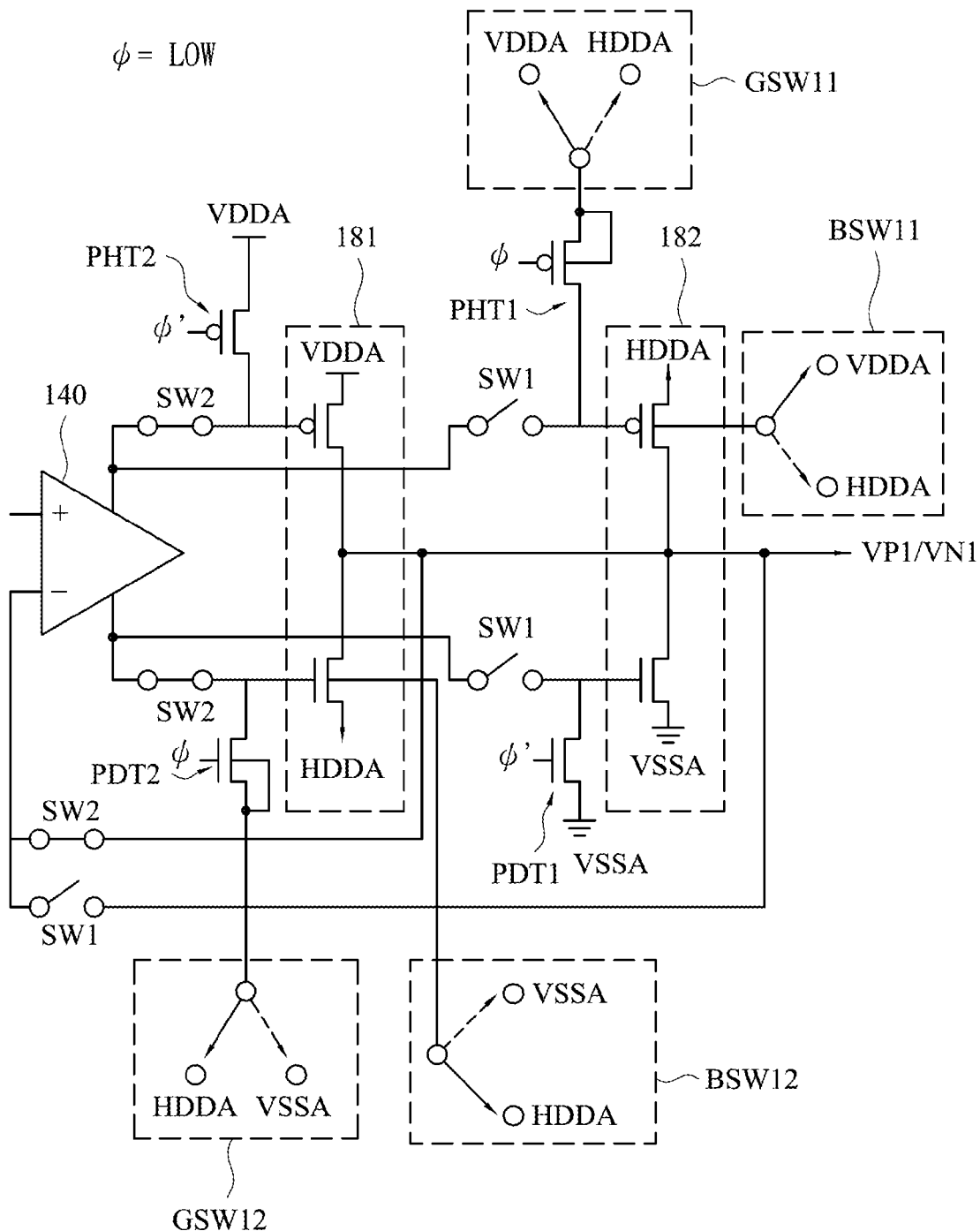
FIG. 7 and FIG. 8 are circuit diagrams showing a partial structure of an output amplifier of a source driver in accordance with an embodiment of the present invention.
Figure 8:
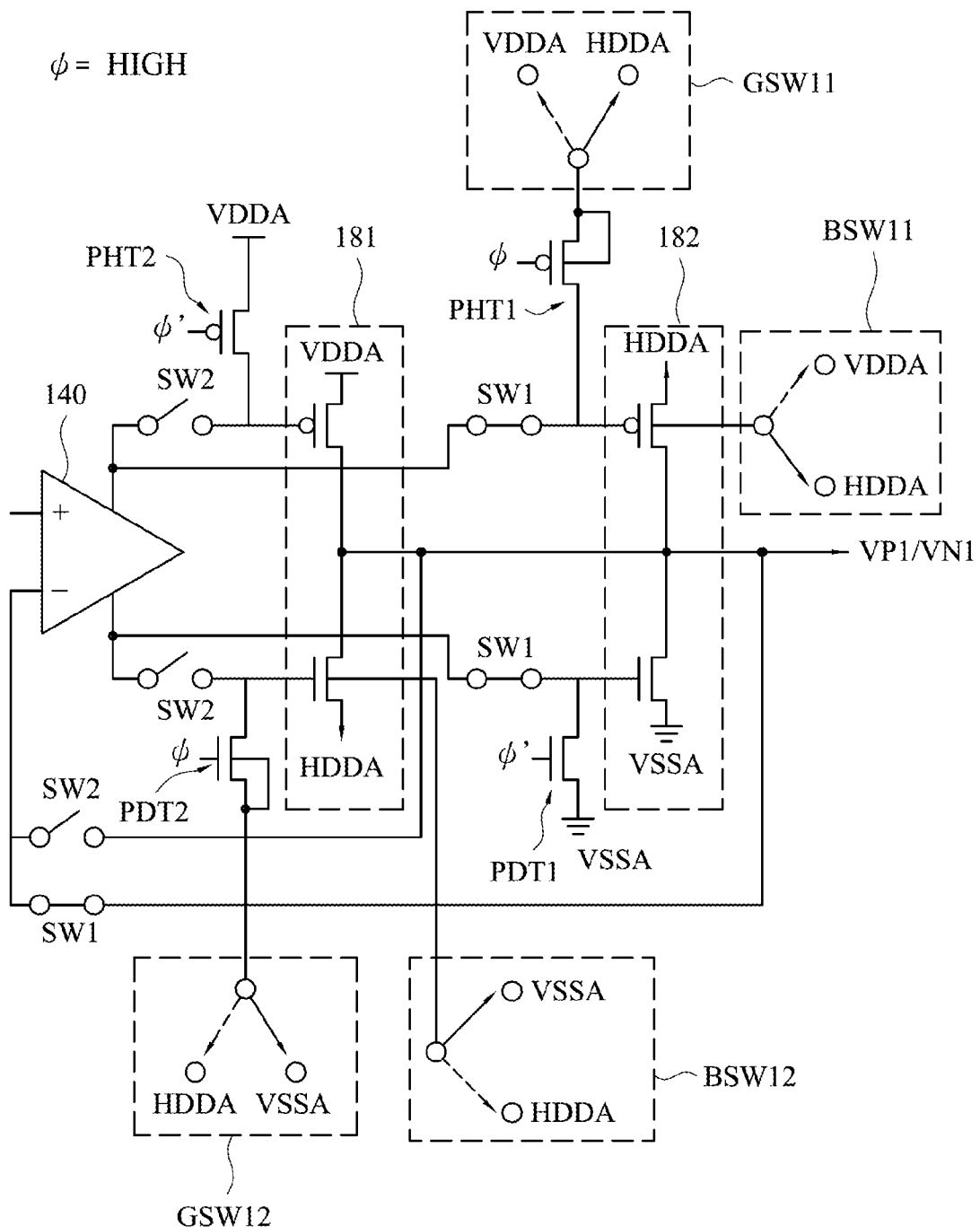

Referring to FIG. 7 and FIG. 8, FIG. 7 and FIG. 8 are circuit diagrams showing a partial structure of an output amplifier of a source driver in accordance with an embodiment of the present invention. The output amplifier of this embodiment is similar to the aforementioned output amplifier including bulk switches. However, the output amplifier of this embodiment further includes a first pull high circuit, a second pull high circuit, a third pull high circuit, a fourth pull high circuit, a first pull low circuit, a second pull low circuit, a third pull low circuit and a fourth pull low circuit. In this embodiment, the pull high circuits and the pull low circuits are used to avoid false action of the PMOSs and the NMOSs of the first positive output stage circuit 181, the first negative output stage circuit 182, the second positive output stage circuit 191 and the second negative output stage circuit 192. Specifically, the first pull high circuit, the second pull high circuit, the first pull low circuit and the second pull low circuit are adapted for the first positive output stage circuit 181 and the first negative output stage circuit 182, and the third pull high circuit, the fourth pull high circuit, the third pull low circuit and the fourth pull low circuit are adapted for the second positive output stage circuit 191 and the second negative output stage circuit 192.

As shown in FIG. 7 and FIG. 8, the first pull high circuit includes a pull high transistor PHT1 and a first gate switch circuit GSW11. The second pull high circuit includes a pull high transistor PHT2. The first pull low circuit includes a pull low transistor PDT1. The second pull low circuit includes a pull low transistor PDT2 and a gate switch circuit GSW12. As shown in FIG. 7, when the polarity signal Φ is logic low, switches SW1 of the second switch circuit 160 are turned off (open) and switches SW2 of the second switch circuit 160 are turned on (shorted). In this case, a voltage level at the gate of the PMOS of the first negative output stage circuit 182 is pulled to the voltage VDDA through the pull high transistor PHT1 and the gate switch circuit GSW11, thereby completely turning off the PMOS of the first negative output stage circuit 182. Further, a voltage level at an input terminal of the pull low transistor PDT2 is pulled to the voltage HDDA through the gate switch circuit GSW12.

As shown in FIG. 8, when the polarity signal Φ is logic high, the switches SW1 are turned on (shorted) and the switches SW2 are turned off (open). In this case, a voltage level at the gate of the NMOS of the first positive output stage circuit 181 is pulled to the voltage VSSA through the pull low transistor PDT2 and the gate switch circuit GSW12, thereby completely turning off the NMOS of the first positive output stage circuit 181. Further, a voltage level at an input terminal of the pull high transistor PHT1 is pulled to the voltage HDDA through the gate switch circuit GSW11.

It can be understood that the gate switch circuit GSW11 selectively provides the voltage VDDA and the voltage HDDA, thereby avoiding false action of the PMOSs of the first negative output stage circuit 182. Similarly, the gate switch circuit GSW12 selectively provides the voltage VSSA and the voltage HDDA, thereby avoiding false action of the NMOSs of the first positive output stage circuit 181.

It is noted that the structures of the second positive output stage circuit 191 and the second negative output stage circuit 192 are the same as the structures of the first positive output stage circuit 181 and the first negative output stage circuit 182, so that the functions and structures of the third pull high circuit, the fourth pull high circuit, the third pull low circuit and the fourth pull low circuit adapted for the second positive output stage circuit 191 and the second negative output stage circuit 192 are the similar to the functions and structures of the first pull high circuit, the second pull high circuit, the first pull low circuit and the second pull low circuit. Therefore, the functions and structures of the third pull high circuit, the fourth pull high circuit, the third pull low circuit and the fourth pull low circuit adapted for the second positive output stage circuit 191 and the second negative output stage circuit 192 are not repeated herein.

Figure 9:
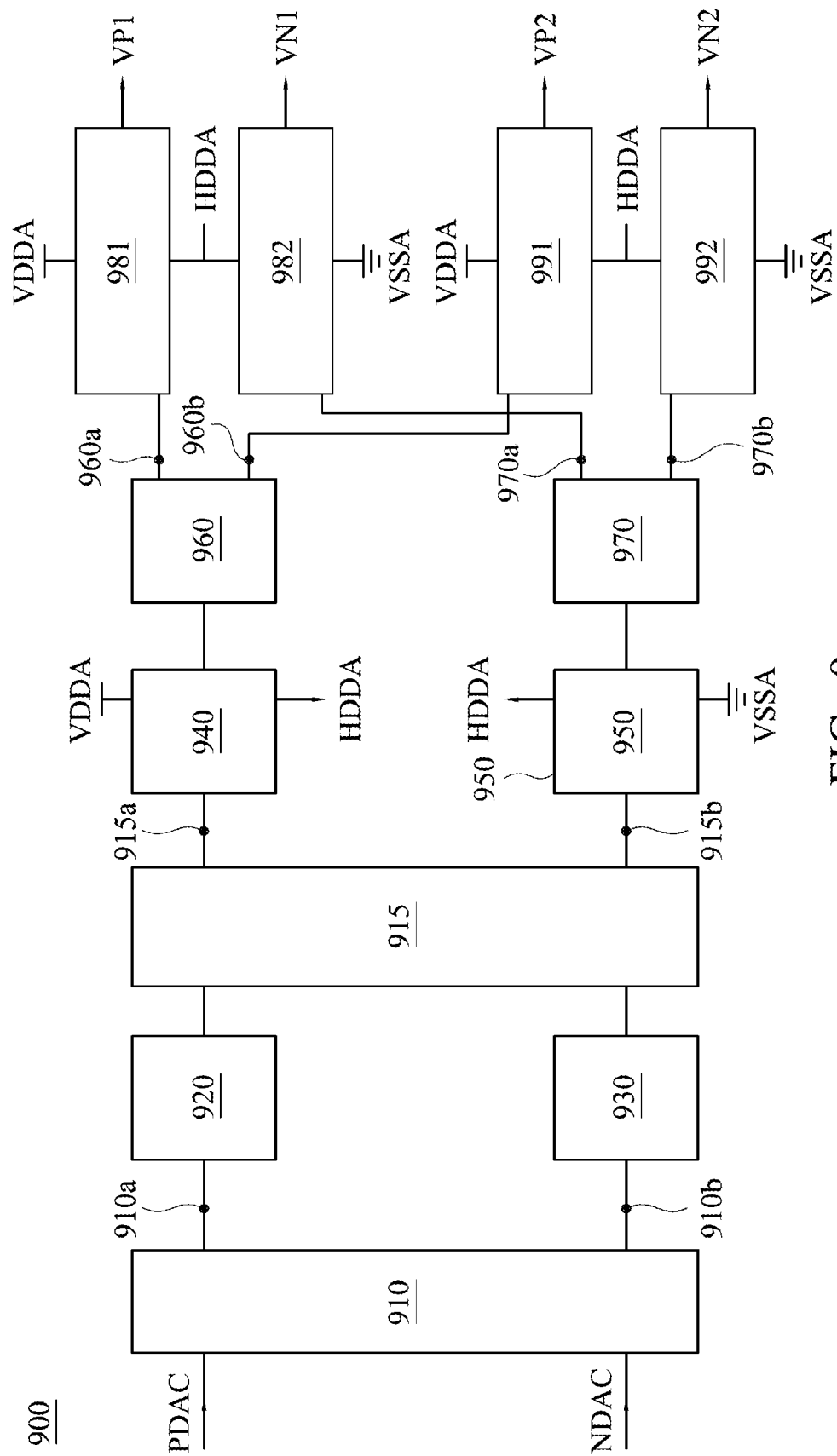
FIG. 9 is a functional block diagram showing a circuit structure of an output amplifier of a source driver in accordance with an embodiment of the present invention.

Referring to FIG. 9, FIG. 9 is a functional block diagram showing a circuit structure of an output amplifier 900 of a source driver in accordance with an embodiment of the present invention. The output amplifier 900 includes a first switch circuit 910, a second switch circuit 915, a first input stage circuit 920, a second input stage circuit 930, a first active load circuit 940, a second active load circuit 950, a third switch circuit 960, a fourth switch circuit 970, a first positive output stage circuit 981, a first negative output stage circuit 982, a second positive output stage circuit 991 and a second negative output stage circuit 992.

The first switch circuit 910 is configured to receive a positive reference signal PDAC and a negative reference signal NDAC from a digital-to-analog converter. The positive reference signal PDAC and the negative reference signal NDAC are provided for performing polarity inversion. The first switch circuit 910 has a first output terminal 910*a* and a second output terminal 910*b* configured to selectively output the positive reference signal PDAC and the negative reference signal NDAC. In this embodiment, the first switch circuit 910 is a multiplexer, but embodiments of the present invention are not limited thereto.

The first input stage circuit 920 is electrically connected to the first output terminal 910*a* of the first switch circuit 910 to receive one of the positive reference signal PDAC and the negative reference signal NDAC and to output a first received reference signal accordingly. The second input stage circuit 930 is electrically connected to the second output terminal 910*b* of the first switch circuit 910 to receive the other one of the positive reference signal PDAC and the negative reference signal NDAC and to output a second received reference signal accordingly. In this embodiment, the first input stage circuit 920 and the second input stage circuit 930 includes a differential pair used to overcome zero drift problems, but embodiments of the present invention are not limited thereto.

The second switch circuit 915 is electrically connected to the first input stage circuit 920 and the second input stage circuit 930 to receive the first received reference signal and the second received reference signal. The second switch circuit 915 has a first output terminal 915*a* and a second output terminal 915*b* to selectively output the first received reference signal and the second received reference signal.

The first active load circuit 940 is electrically connected to the first output terminal 915*a* of the second switch circuit 915, and the second active load circuit 150 is electrically connected to the second output terminal 915*b* of the second switch circuit 915. In this embodiment, each of the first active load circuit 940 and the second active load circuit 950 includes a current mirror circuit, but, embodiments of the present invention are not limited thereto.

The third switch circuit 960 is electrically connected to the first active load circuit 940 to receive a signal provided by the first active load circuit 940 (one of the first received reference signal and the second received reference signal). The fourth switch circuit 970 is electrically connected to the second active load circuit 950 to receive a signal provided by the second active load circuit 950 (the other one of the first received reference signal and the second received reference signal).

The third switch circuit 960 has a first output terminal 960*a* and a second output terminal 960*b*, and the third switch circuit 960 is configured to select one of the first output terminal 960*a* and the second output terminal 960*b* to output the signal received from the first active load circuit 940. Similarly, the fourth switch circuit 970 has a first output terminal 970*a* and a second output terminal 970*b*, and fourth switch circuit 970 is configured to select one of the first output terminal 970*a* and the second output terminal 970*b* to output the signal from the second active load circuit 950. In this embodiment, the second switch circuit 960 and the third switch circuit 970 are multiplexers, but embodiments are not limited thereto.

The first positive output stage circuit 981 is electrically connected to the first output terminal 960*a* of the third switch circuit 960, and the second positive output stage circuit 991 is electrically connected to the second output terminal 960*b* of the third switch circuit 960. The first positive output stage circuit 981 and the second positive output stage circuit 991 are configured to output voltage signals VP1 and VP2 used for polarity inversion.

The first negative output stage circuit 982 is electrically connected to the first output terminal 970*a* of the fourth switch circuit 970, and the second negative output stage circuit 992 is electrically connected to the second output terminal 970*b* of the fourth switch circuit 970. The first negative output stage circuit 982 and the second negative output stage circuit 992 are configured to output voltage signals VN1 and VN2 used for polarity inversion.

In this embodiment, an output terminal of the first positive output stage circuit 981 and an output terminal of the first negative output stage circuit 982 are electrically connected together, and an output terminal of the second positive output stage circuit 991 and an output terminal of the second negative output stage circuit 992 are electrically connected together.

In addition, each of the first positive output stage circuit 981, the first negative output stage circuit 982, the second positive output stage circuit 991 and the second negative output stage circuit 992 includes a complementary transistor pair, and the complementary transistor pair includes a N-type field-effect transistor and a P-type field-effect transistor. Further, the voltage signals VP1 and VP2 represent positive signals used for polarity inversion, and the voltage signal VN1 and VN2 represent negative signals used for polarity inversion.

Figure 10:
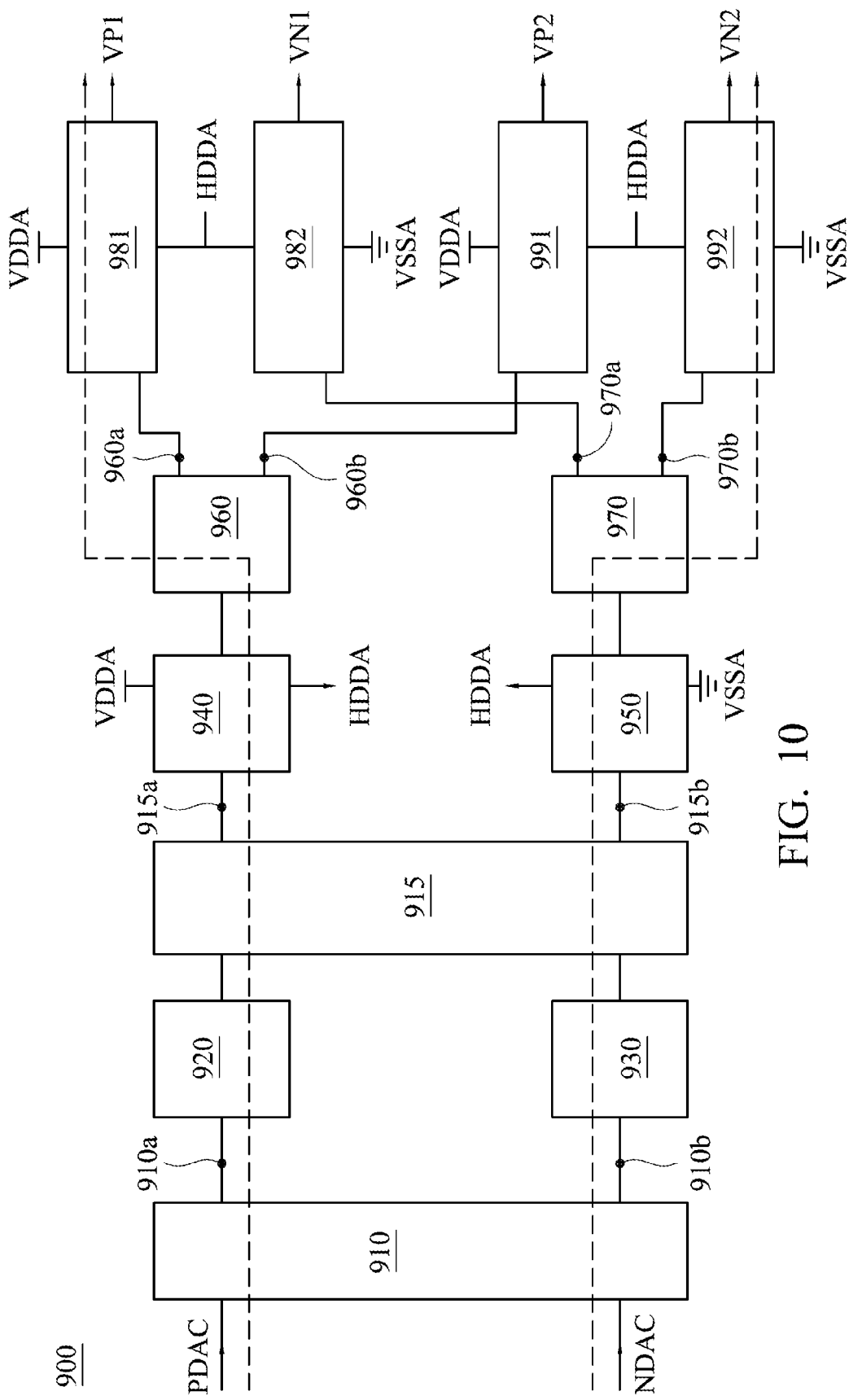
FIG. 10 and FIG. 11 are schematic diagrams showing signal paths of the source driver in accordance with an embodiment of the present invention.
Figure 11:
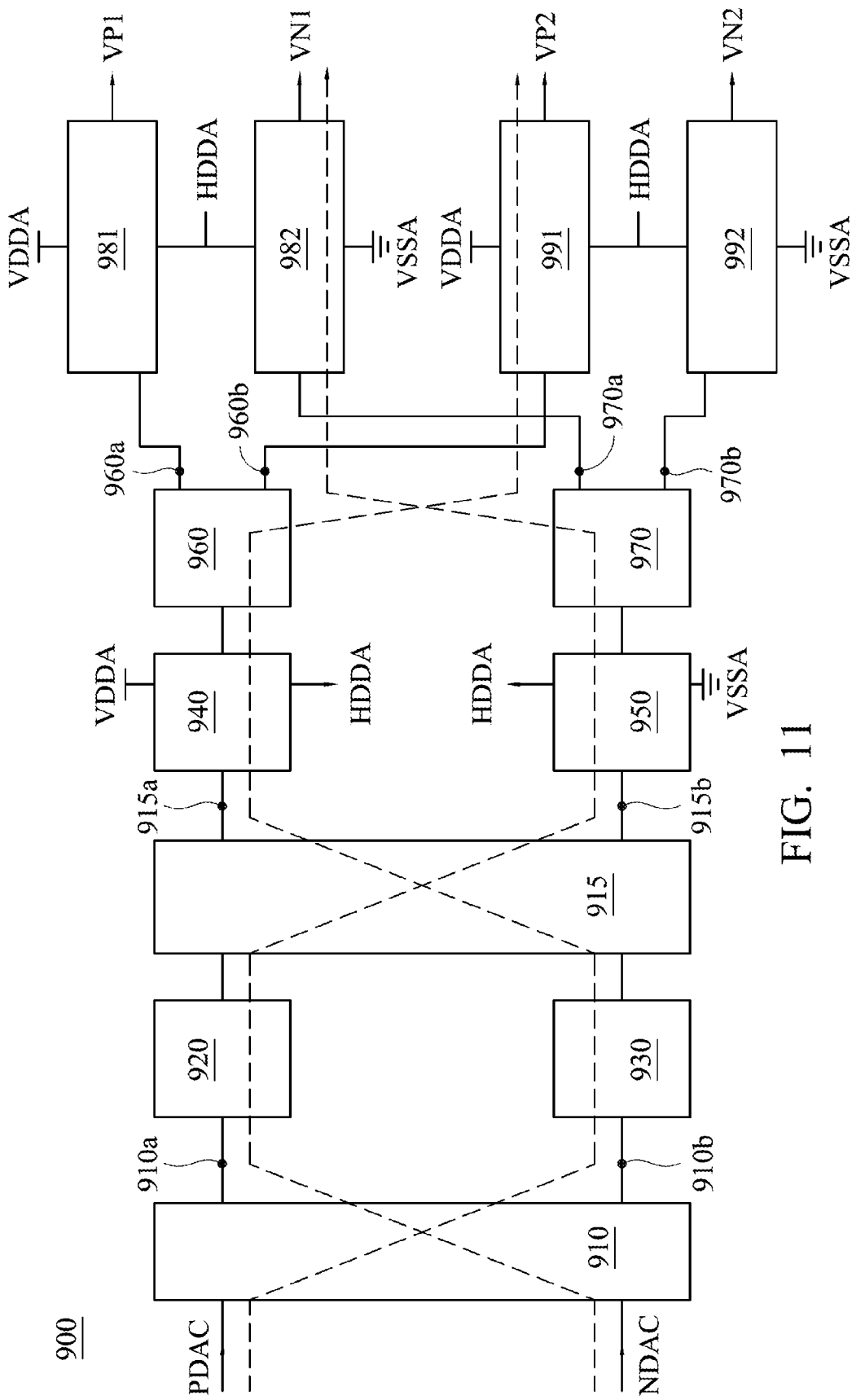
Figure 12A:
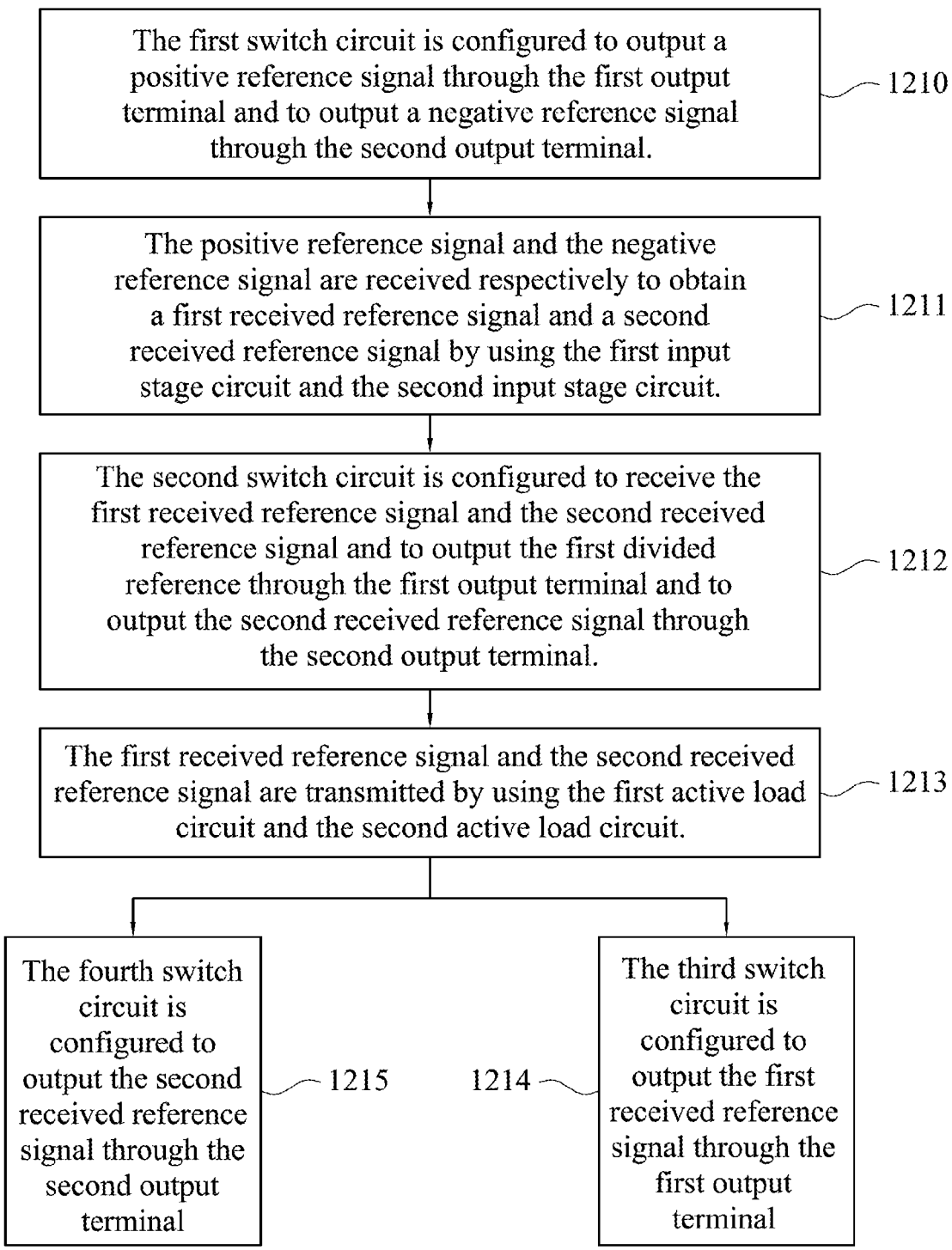
FIGS. 12a-12b are schematic diagrams showing a flow chart of a control method of the source driver in accordance with an embodiment of the present invention.
Figure 12B:
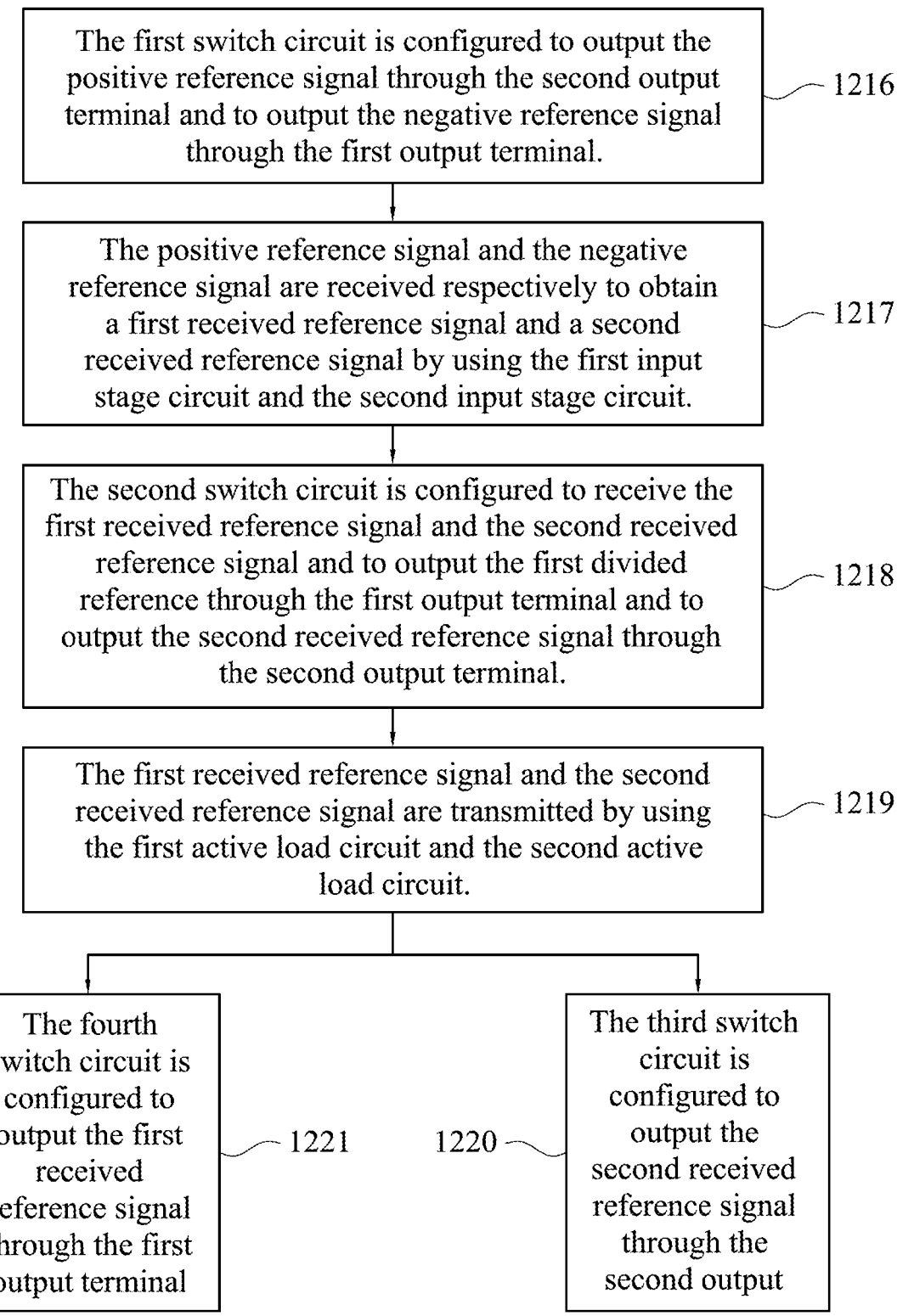

Referring to FIG. 10, FIG. 11 and FIGS. 12*a*-12*b*, FIG. 10 and FIG. 11 are schematic diagrams showing signal paths of the source driver 900 in accordance with the embodiment of the present invention, and FIGS. 12*a*-12*b* are schematic diagrams showing a flow chart of a control method 1200 of the source driver 900. The control method 900 includes a first display stage and a second display stage performed alternatively. The signal paths in FIG. 10 and steps 1210-1215 in FIG. 12*a* correspond to the first display stage, and the signal paths in FIG. 11 and steps 1216-1221 in FIG. 12*b* correspond to the second display stage.

As shown in FIG. 10 and FIG. 12*a*, in the first display stage, at first, the step 1210 is performed. In the step 1210, the first switch circuit 910 is configured to output the positive reference signal PDAC through the first output terminal 910*a* and to output the negative reference signal NDAC through the second output terminal 910*b*. Then, the step 1211 is performed. In the step 1211, the positive reference signal PDAC and the negative reference signal NDAC are respectively received by the first input stage circuit 920 and the second input stage circuit 930. For example, the positive reference signal PDAC is received by the first input stage circuit 920 and the first input stage circuit 920 outputs a first received reference signal accordingly. For another example, the negative reference signal NDAC is received by the second input stage circuit 930 and the second input stage circuit 930 outputs a second received reference signal accordingly.

Thereafter, the step 1212 is performed. in the step 1212, the first received reference signal and the second received reference signal are received by the second switch circuit 915, and the second switch circuit 915 is configured to output the first received reference signal through the first output terminal 915*a* and to output the second received reference signal through the second output terminal 915*b*.

Then, the step 1213 is performed. In the step 1213, the first received reference signal and the second received reference signal are respectively received by the first active load circuit 940 and the second active load circuit 950. For example, the first active load circuit 940 receives the first received reference signal from the first output terminal 915*a* of the second switch circuit 915, and the second active load circuit 950 receives the second received reference signal from the second output terminal 915*b* of the second switch circuit 915.

Thereafter, the step 1214 and the step 1215 are performed. In the step 1214, the third switch circuit 960 is configured to receive the first received reference signal and to output the first received reference signal through the first output terminal 960*a*, thereby enabling the first positive output stage circuit 981 to output the voltage signal VP1. In the step 1215, the fourth switch circuit 970 is configured to receive the second received reference signal and to output the second received reference signal through the second output terminal 970*b*, thereby enabling the second negative output stage circuit 992 to output the voltage signal VN2.

As shown in FIG. 11 and FIG. 12*b*, in the second display stage performed after the first display stage, at first, the step 1216 is performed. In the step 1216, the first switch circuit 910 is switched to output the positive reference signal PDAC through the second output terminal 910*b* and to output the negative reference signal NDAC through the first output terminal 910*a*. Then, the step 1217 is performed. In the step 1217, the positive reference signal PDAC and the negative reference signal NDAC are respectively received by the first input stage circuit 920 and the second input stage circuit 930. For example, the negative reference signal NDAC is received by the first input stage circuit 920 and the first input stage circuit 920 outputs a first received reference signal accordingly. For another example, the positive reference signal PDAC is received by the second input stage circuit 930 and the second input stage circuit 930 outputs a second received reference signal accordingly.

Thereafter, the step 1218 is performed. In the step 1218, the first received reference signal and the second received reference signal are received by the second switch circuit 915, and the second switch circuit 915 is switched to output the first received reference signal through the second output terminal 915*b* and to output the second received reference signal through the first output terminal 915*a*.

Then, the step 1219 is performed. In the step 1219, the first received reference signal and the second received reference signal are respectively received by the first active load circuit 140 and the second active load circuit 150. For example, the first active load circuit 140 receives the second received reference signal from the first input stage circuit 120, and the second active load circuit 150 receives the first received reference signal from the second input stage circuit 130.

Thereafter, the step 1220 and the step 1221 are performed. In the step 1220, the third switch circuit 960 is configured to receive the second received reference signal and to output the second received reference signal through the second output terminal 960*b*, thereby enabling the second positive output stage circuit 991 to output the voltage signal VP2. In the step 1221, the fourth switch circuit 970 is configured to receive the first received reference signal and to output the first received reference signal through the first output terminal 970*a*, thereby enabling the first negative output stage circuit 982 to output the voltage signal VN1.

It can be understood that the output amplifier 900 of this embodiment does not include a switch circuit disposed after the first positive output stage circuit 981, the second positive output stage circuit 991, the first negative output stage circuit 982 and the second negative output stage circuit 992. Therefore, the output amplifier 900 has decreased power consumption. Further, comparing with the output amplifier 100, the output amplifier 900 is operated in a different switching manner. For example, the output amplifier 900 further includes the second switch circuit 915 to switch the output signal outputted by the input stage circuits and the first switch circuit 910, the second switch circuit 915, the third switch circuit 960, and the fourth switch circuit 970 are switched in the different switching manner. Therefore, the output amplifier 900 has a decreased static current.

Figure 13A:
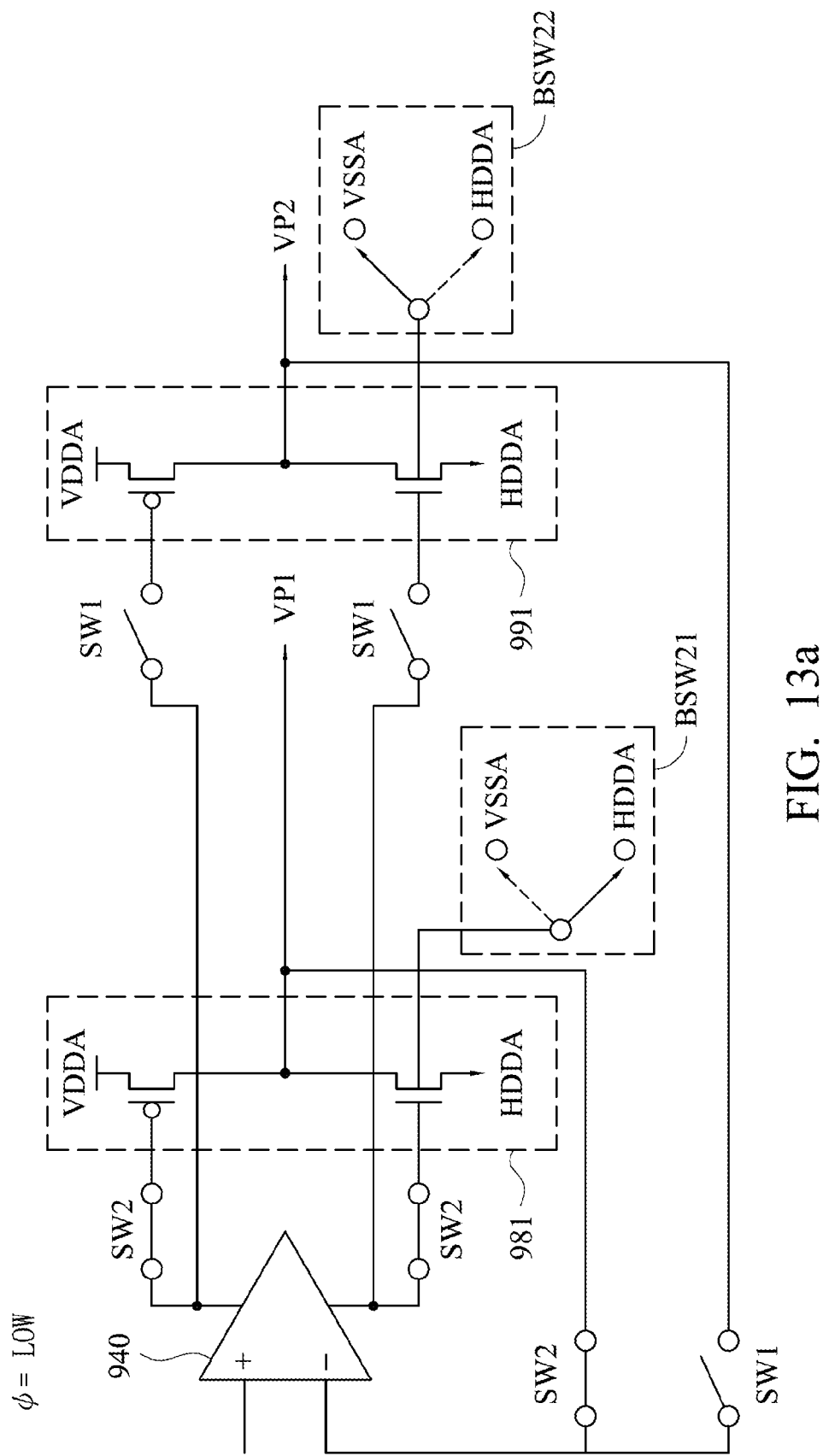
FIG. 13a and FIG. 13b are circuit diagrams showing a partial structure of an output amplifier of a source driver in accordance with an embodiment of the present invention.
Figure 13B:
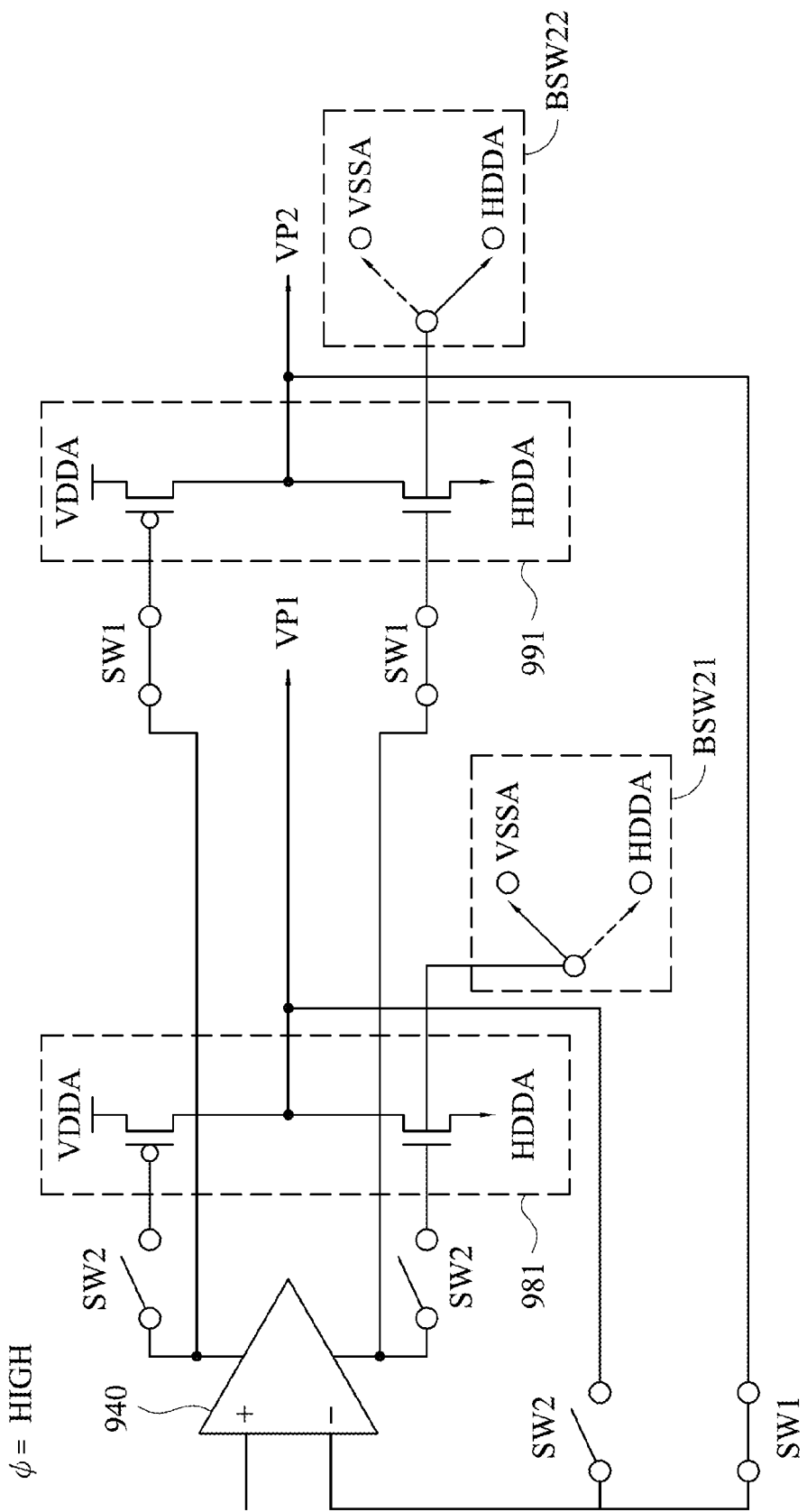

Referring FIG. 13*a* and FIG. 13*b*, FIG. 13*a* and FIG. 13*b* are circuit diagrams showing a partial structure of an output amplifier of a source driver in accordance with an embodiment of the present invention. The output amplifier of this embodiment is similar to the output amplifier 900. However, the output amplifier of this embodiment further includes bulk switch circuits such as a first bulk switch circuit BSW21, a second bulk switch circuit BSW22, a third bulk switch circuit, a fourth bulk switch circuit to solve a problem of PN junction forward, in which the first bulk switch circuit BSW21 and a second bulk switch circuit BSW22 are adapted for the first positive output stage circuit 981 and the second positive output stage circuit 991, and the third bulk switch circuit and the fourth bulk switch circuit are adapted for the first negative output stage circuit 982 and the second negative output stage circuit 992.

Since an output terminal of the first positive output stage circuit 981 and an output terminal of the first negative output stage circuit 982 are electrically connected together, the problem of PN junction forward occurs when one of the first positive output stage circuit 981 and the first negative output stage circuit 982 receives the first received reference signal from the first active load circuit 940. Similarly, since an output terminal of the second positive output stage circuit 991 and an output terminal of the second negative output stage circuit 992 are electrically connected together, the problem of PN junction forward occurs when one of the second positive output stage circuit 991 and the second negative output stage circuit 992 receives the second received reference signal from the second active load circuit 950.

Figure 14A:
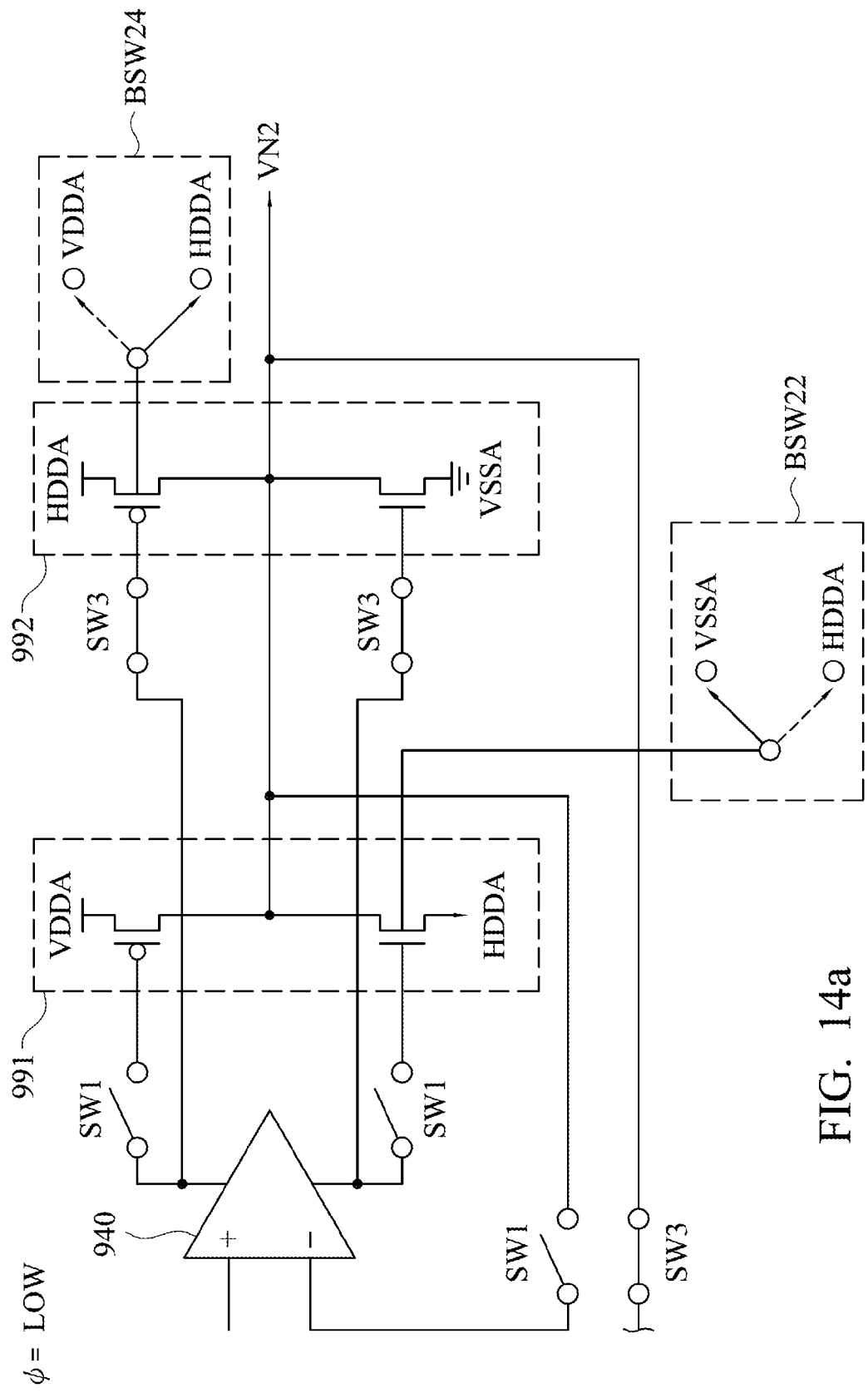
FIG. 14a and FIG. 14b are circuit diagrams showing a partial structure of an output amplifier of a source driver in accordance with an embodiment of the present invention.

Referring to FIG. 13a and FIG. 14a, when a polarity signal (1) of a timing controller is logic low, switches SW1 of the third switch circuit 960 are turned off (open) and switches SW2 of the third switch circuit 960 are turned on (shorted). Further, switches SW3 of the fourth switch circuit 970 are turned on, too. In this case, the second negative output stage circuit 992 is operated to provide the voltage signal VN2 according to the signal from the second active load circuit 950. The voltage signal VN2 is applied to the output terminal of the second positive output stage circuit 991. At this time, if the voltage HDDA is still applied to the body of the NMOS of the second positive output stage circuit 991, a PN junction of the NMOS of the second positive output stage circuit 991 is forward biased since the voltage signal VN2 is smaller than the voltage HDDA. Therefore, an undesired current path is formed due to the problem of PN junction forward.

To solve the problem of PN junction forward with respect to the NMOS of the second positive output stage circuit 991, the second bulk switch circuit BSW22 is switched to electrically connect the ground power voltage source having the voltage VSSA with the bulk of the NMOS of the second positive output stage circuit 991. Because the voltage signal VN2 from the second negative output stage circuit 992 is greater than the voltage VSSA, the PN junction of the NMOS of the second positive output stage circuit 991 is reverse biased, and thus the problem of PN junction forward with respect to the NMOS of the second positive output stage circuit 991 is solved.

Figure 14B:
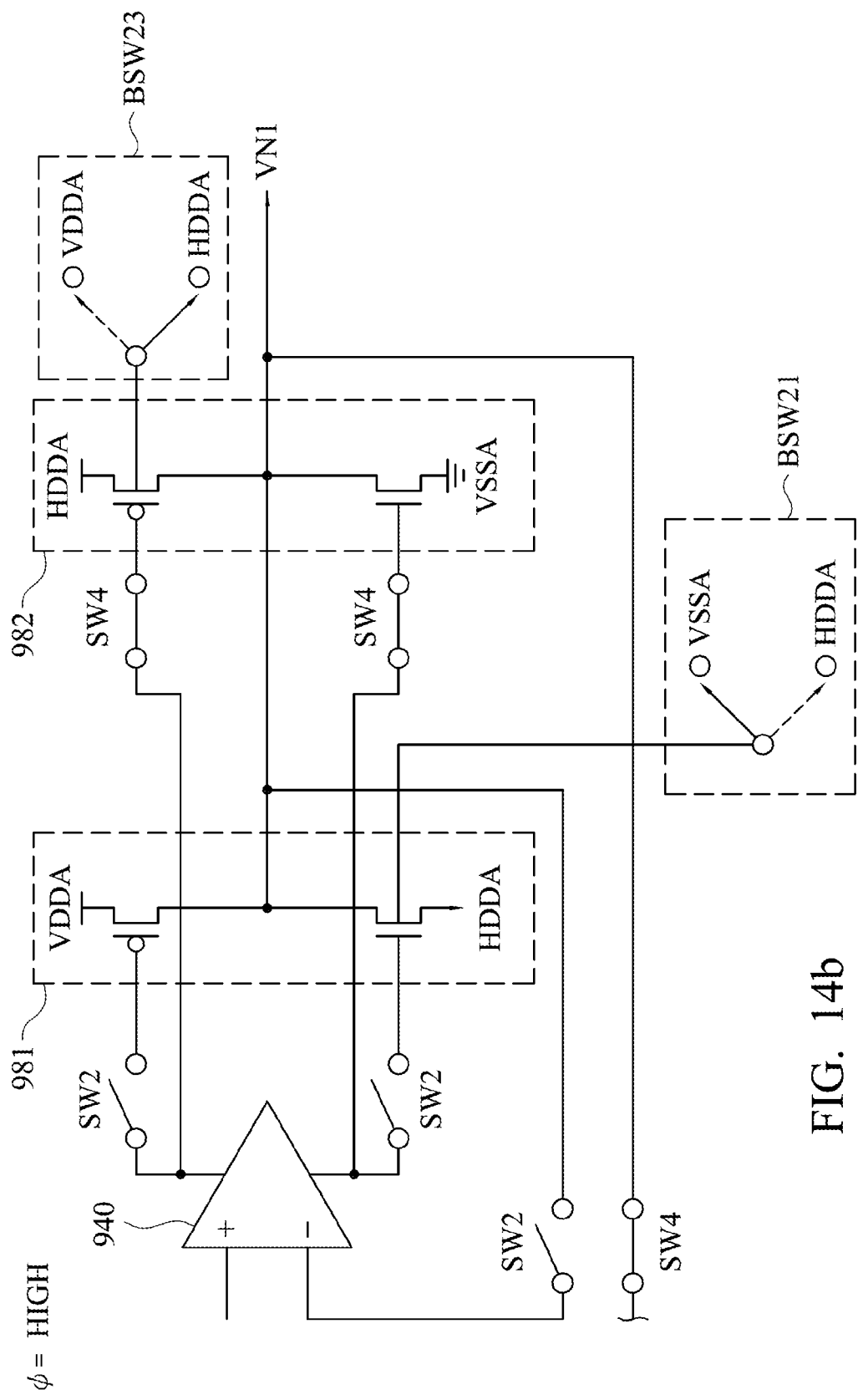

Referring to FIG. 13b and FIG. 14b, when the polarity signal 1 of the timing controller is logic high, the switches SW1 are turned on (shorted) and the switches SW2 are turned off (open). Further, switches SW4 of the fourth switch circuit 970 are turned on, too. In this case, the first negative output stage circuit 982 is operated to provide the voltage signal VN1 according to the signal from the second active load circuit 950. The voltage signal VN1 is applied to the output terminal of the first positive output stage circuit 981. At this time, if the voltage HDDA is still applied to the body of the NMOS of the first positive output stage circuit 981, a PN junction of the NMOS of the first positive output stage circuit 981 is forward biased since the voltage signal VN1 is smaller than the voltage HDDA. Therefore, an undesired current path is formed due to the problem of PN junction forward.

To solve the problem of PN junction forward with respect to the NMOS of the first positive output stage circuit 981, the first bulk switch circuit BSW21 is switched to electrically connect the ground voltage source having the voltage VSSA with the bulk of the NMOS of the first positive output stage circuit 981. Because the voltage signal VN1 from the first negative output stage circuit 982 is greater than the voltage VSSA, the PN junction of the NMOS of the first positive output stage circuit 981 is reverse biased, and thus the problem of PN junction forward with respect to the NMOS of the first positive output stage circuit 981 is solved.

In addition, the PMOSs of the first negative output stage circuit 982 and the second negative output stage circuit 992 have the problem of PN junction forward, since the structures of the first negative output stage circuit 982 and the second negative output stage circuit 992 are similar to the structure of the first negative output stage circuit 182, the functions and structures of the third bulk switch circuit BSW23 and the forth bulk switch circuit BSW24 adapted for the first negative output stage circuit 982 and the second negative output stage circuit 992 are similar to the function and structure of the first bulk switch circuit BSW11 and not repeated herein.

In this embodiment, when an output stage circuit is selected to output a voltage signal, a bulk switch circuit corresponding thereto is switched to connect with the half-power voltage source having the voltage HDDA. In contrast, when an output stage circuit is not selected to output a voltage signal, a bulk switch circuit corresponding thereto is switched to connect with the power voltage source having the voltage VDDA or the ground voltage source having the voltage VSSA. Therefore, the problem of PN junction forward is solved.

Figure 15:
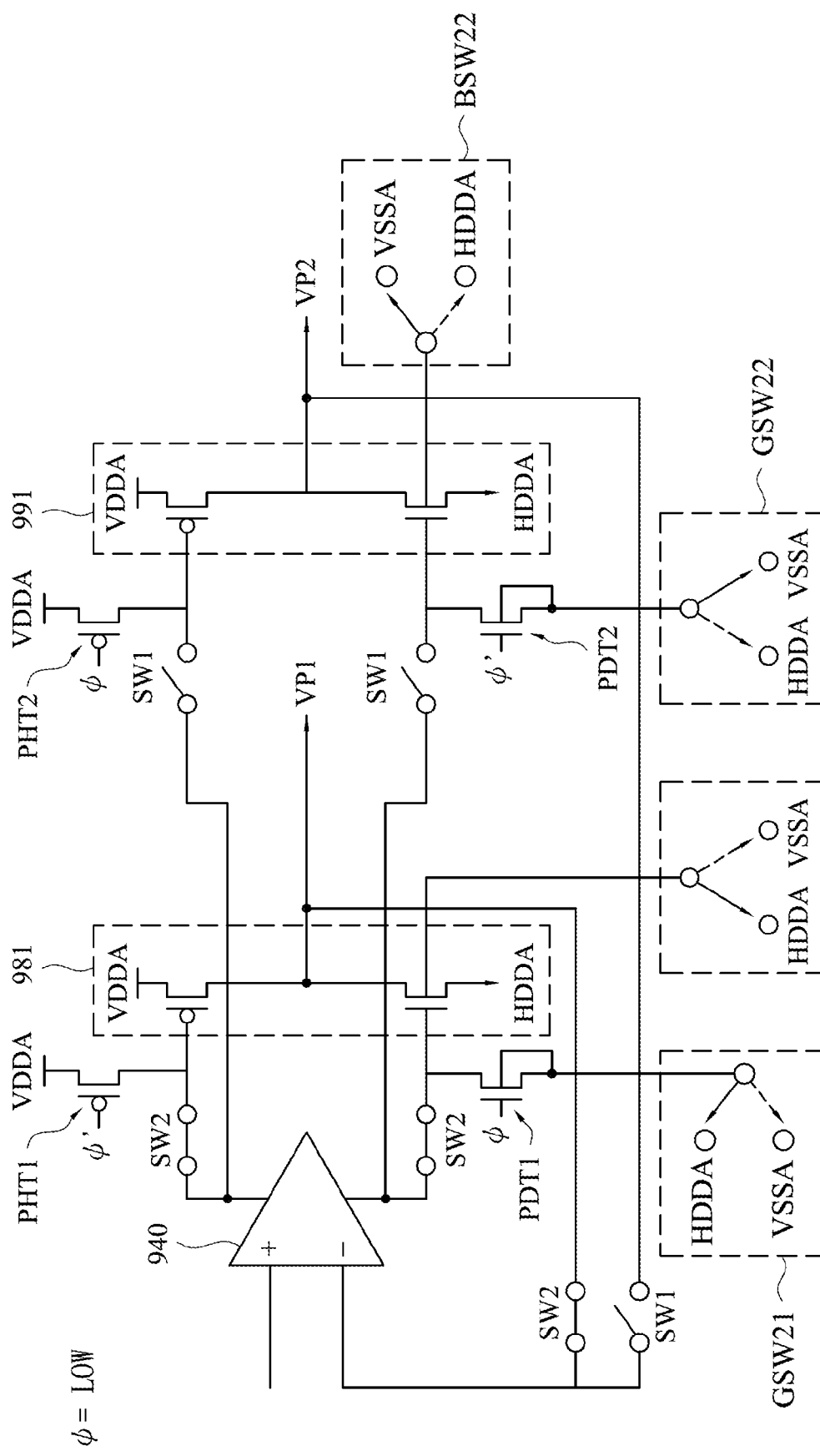
FIG. 15 and FIG. 16 are circuit diagrams showing a partial structure of an output amplifier of a source driver in accordance with an embodiment of the present invention.
Figure 16:
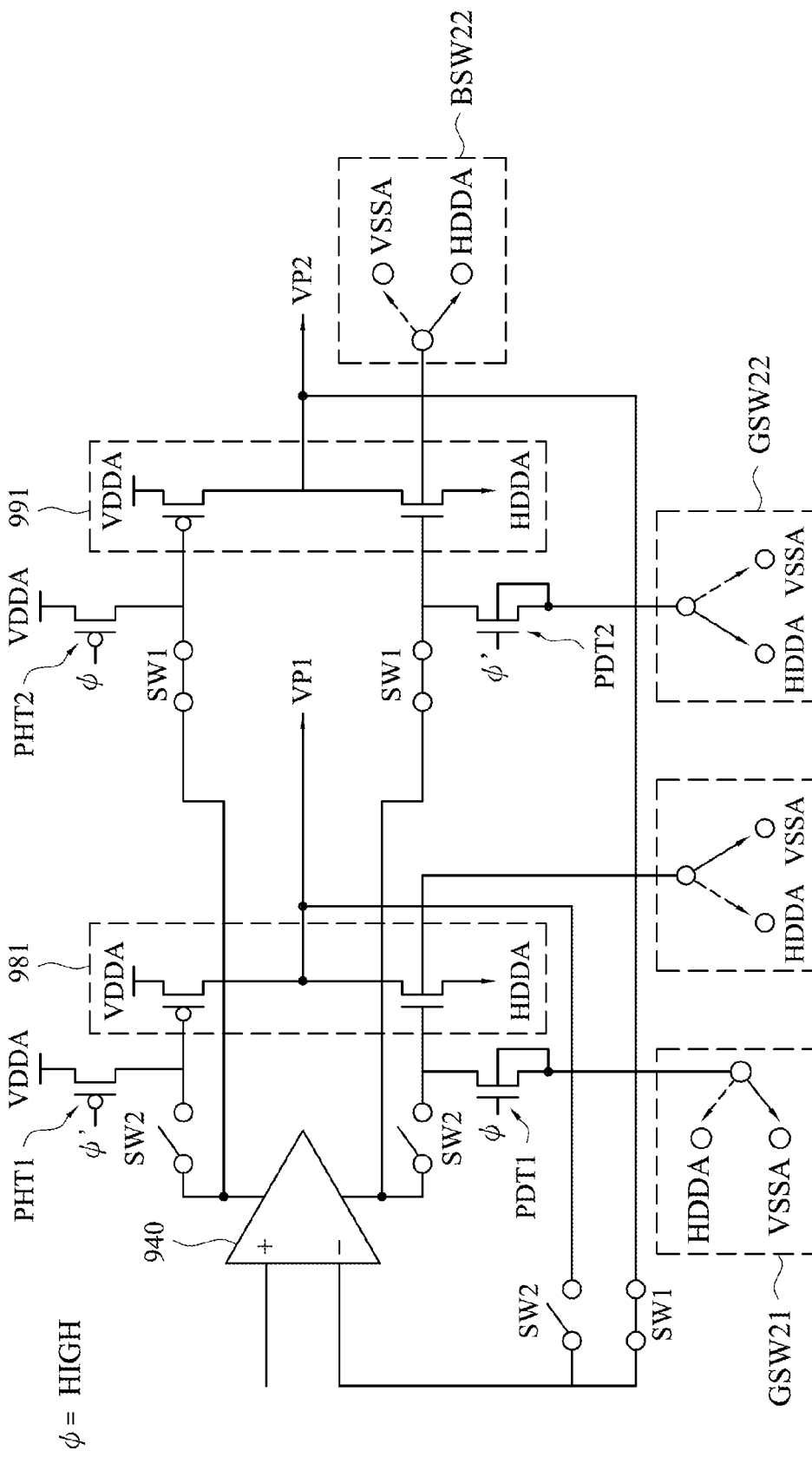

Referring to FIG. 15 and FIG. 16, FIG. 15 and FIG. 16 are circuit diagrams showing a partial structure of an output amplifier of a source driver in accordance with an embodiment of the present invention. The output amplifier of this embodiment is similar to the aforementioned output amplifier including bulk switches. However, the output amplifier of this embodiment further includes a first pull high circuit, a second pull high circuit, a third pull high circuit, a fourth pull high circuit, a first pull low circuit, a second pull low circuit, a third pull low circuit and a fourth pull low circuit. In this embodiment, the pull high circuits and the pull low circuits are used to avoid false action of the PMOSs and the NMOSs of the first positive output stage circuit 981, the first negative output stage circuit 982, the second positive output stage circuit 991 and the second negative output stage circuit 992. Specifically, the first pull high circuit, the second pull high circuit, the first pull low circuit and the second pull low circuit are adapted for the first positive output stage circuit 981 and the second positive output stage circuit 991, and the third pull high circuit, the fourth pull high circuit, the third pull low circuit and the fourth pull low circuit are adapted for the first negative output stage circuit 982 and the second negative output stage circuit 992.

As shown in FIG. 15 and FIG. 16, the first pull high circuit includes a pull high transistor PHT1. The second pull high circuit includes a pull high transistor PHT2. The first pull low circuit includes a pull low transistor PDT1 and a gate switch circuit GSW21. The second pull low circuit includes a pull low transistor PDT2 and a gate switch circuit GSW22.

As shown in FIG. 15, when the polarity signal Φ is logic low, switches SW1 of the second switch circuit 160 are turned off (open) and switches SW2 of the second switch circuit 160 are turned on (shorted). In this case, a voltage level at the gate of the NMOS of the second positive output stage circuit 991 is pulled to the voltage VSSA through the pull low transistor PDT2 and the gate switch circuit GSW22, thereby completely turning off the NMOS of the second positive output stage circuit 991. Further, a voltage level at an input terminal of the pull low transistor PDT1 is pulled to the voltage HDDA through the gate switch circuit GSW21.

As shown in FIG. 16, when the polarity signal Φ is logic high, the switches SW1 are turned on (shorted) and the switches SW2 are turned off (open). In this case, a voltage level at the gate of the NMOS of the first positive output stage circuit 981 is pulled to the voltage VSSA (dot line) through the pull low transistor PDT1 and the gate switch circuit GSW21, thereby completely turning off the NMOS of the first positive output stage circuit 981. Further, a voltage level at an input terminal of the pull low transistor PDT2 is pulled to the voltage HDDA through the gate switch circuit GSW22, thereby avoiding the body effect on the pull low transistor PDT2.

It can be understood that the gate switch circuit GSW21 and the gate switch circuit GSW22 selectively provide the voltage VSS and the voltage HDDA, thereby avoiding false action of the NMOSs of the first positive output stage circuit 981 and the second positive output stage circuit 991.

It is noted that the structures of the first negative output stage circuit 982 and the second negative output stage circuit 992 are similar to the structure of the first negative output stage circuit 182, so that the functions and structures of the third pull high circuit, the fourth pull high circuit, the third pull low circuit and the fourth pull low circuit adapted for the first negative output stage circuit 982 and the second negative output stage circuit 992 are similar to the functions and structures of the pull high circuit and the pull low circuit adapted for the first negative output stage circuit 182 (for example, the pull high transistor PHT1, the first gate switch circuit GSW11 and the pull low transistor PDT1). Therefore, the functions and structures of the third pull high circuit, the fourth pull high circuit, the third pull low circuit and the fourth pull low circuit adapted for the first negative output stage circuit 982 and the second negative output stage circuit 992 are not repeated herein.

Figure 17:
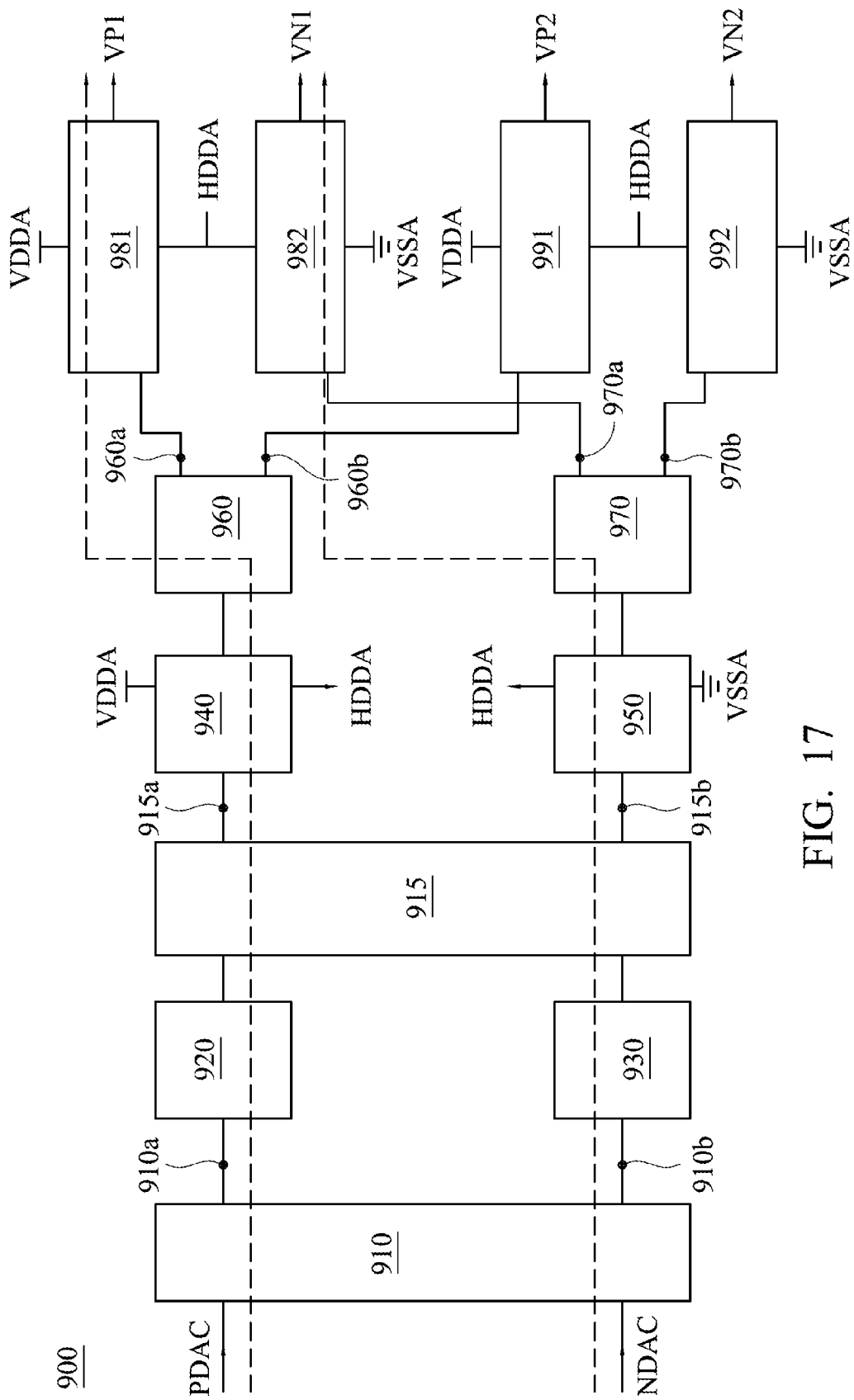
FIG. 17 and FIG. 18 are schematic diagrams showing signal paths of the source driver in accordance with an embodiment of the present invention.
Figure 18:
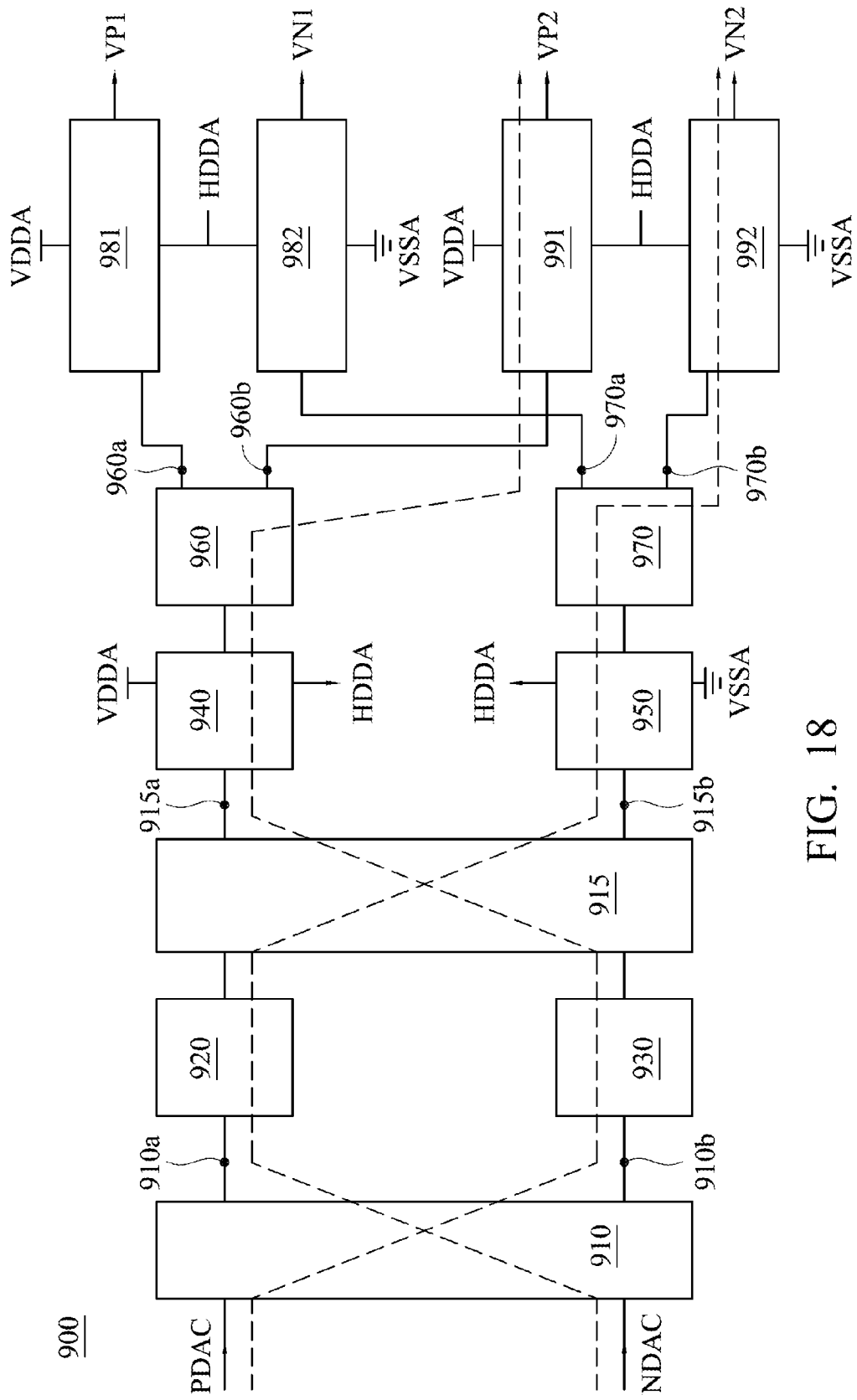

Referring to FIG. 17 and FIG. 18, FIG. 17 and FIG. 18 are schematic diagrams showing signal paths of the source driver 900 in accordance with an embodiment of the present invention. This embodiment provides another control method to control the first switch circuit 910, the second switch circuit 915, the third switch circuit 960 and the fourth switch circuit 970. The control method of this embodiment is similar to the control method 1200, but the differences are in that, the fourth switch circuit 970 is configured to output the signal from the active load circuit 950 to the first negative output stage circuit 982 when the third switch circuit 960 is configured to output the signal from the active load circuit 940 to the first positive output stage circuit 981, and the fourth switch circuit 970 is configured to output the signal from the active load circuit 950 to the second negative output stage circuit 992 when the third switch circuit 960 is configured to output the signal from the active load circuit 940 to the second positive output stage circuit 991.

Figure 19:
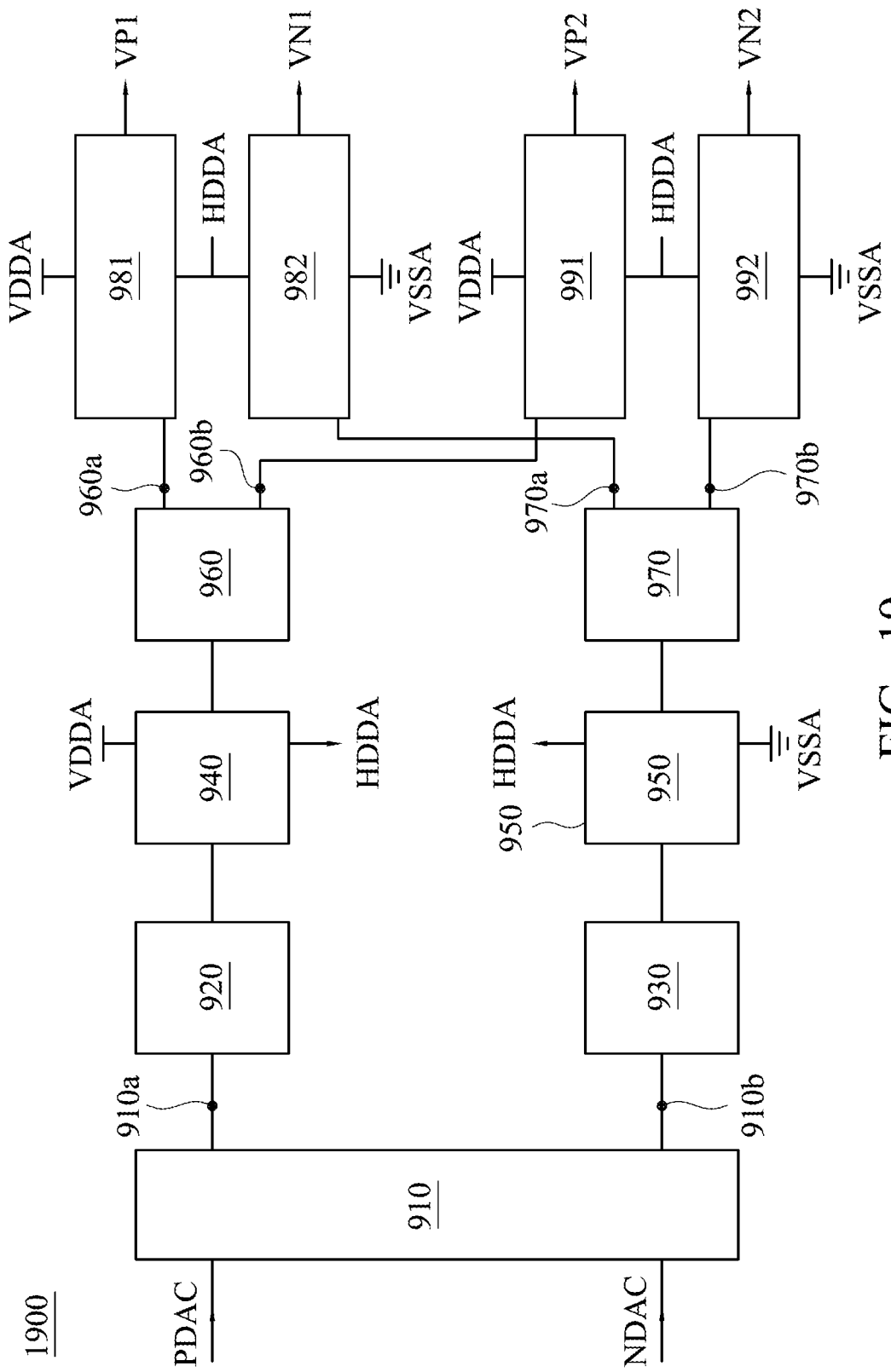
FIG. 19 is a functional block diagram showing a circuit structure of an output amplifier of a source driver in accordance with an embodiment of the present invention.
Figure 20:
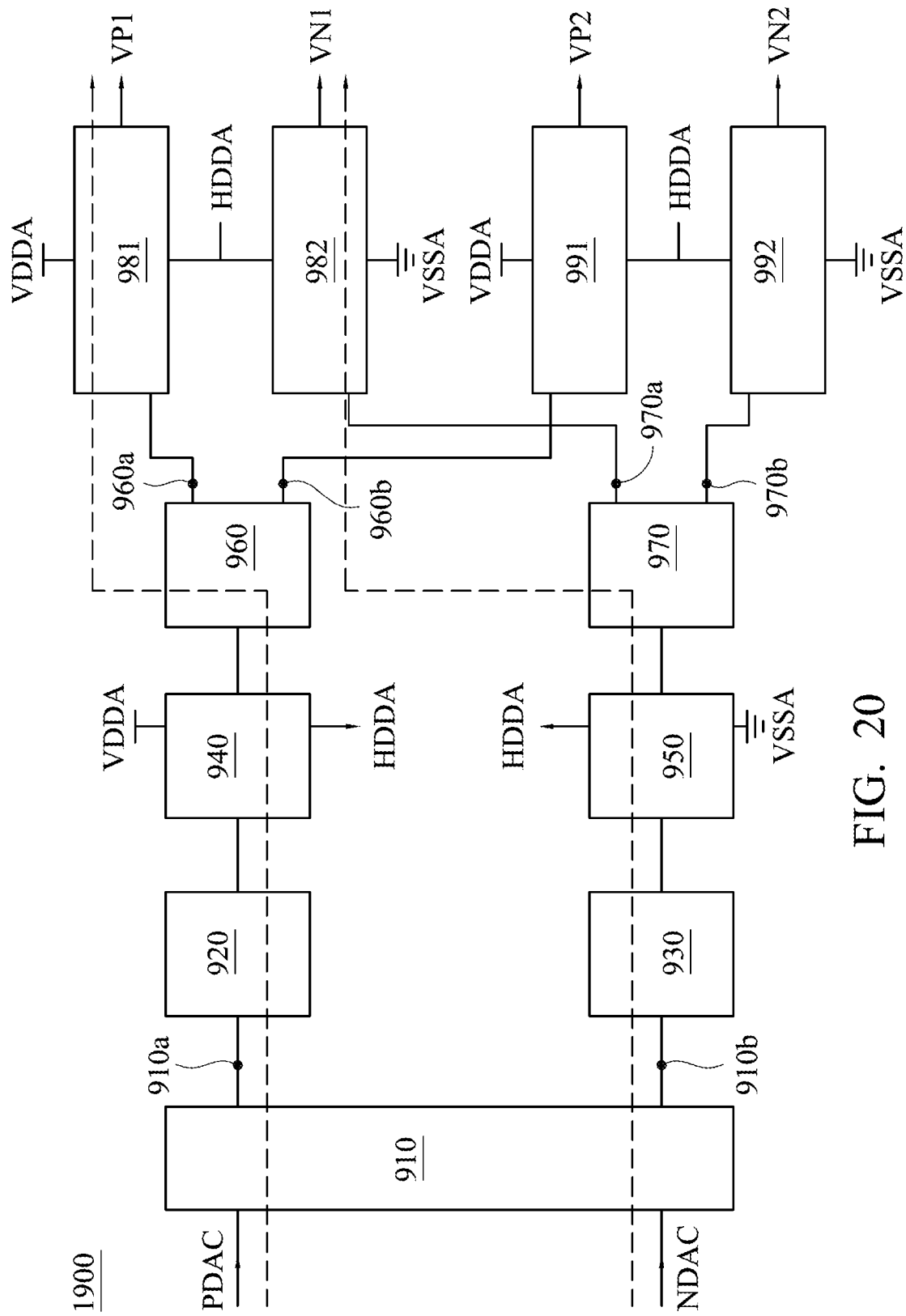
FIG. 20 and FIG. 21 are schematic diagrams showing signal paths of the source driver in accordance with an embodiment of the present invention.
Figure 21:
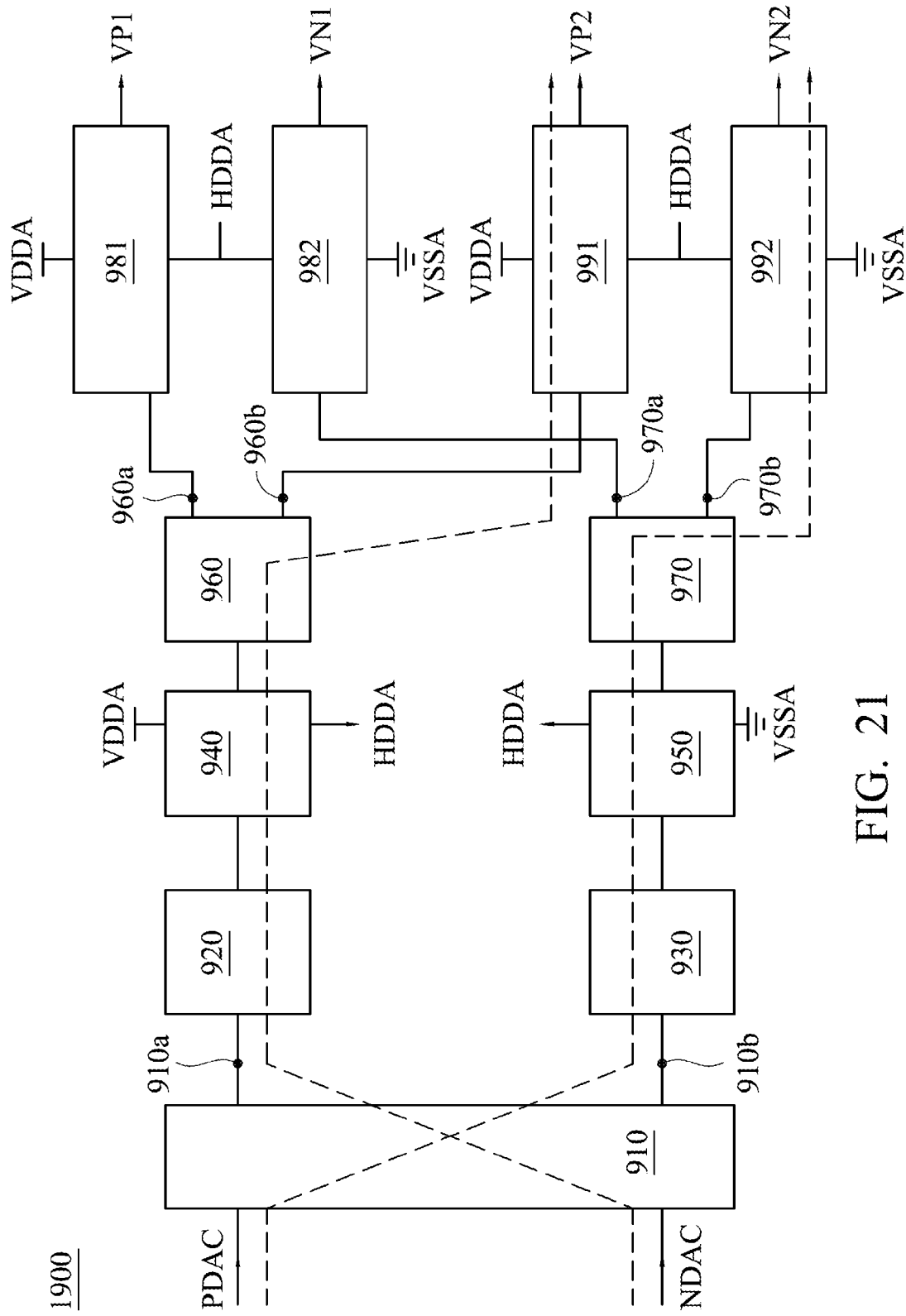

Referring to FIGS. 19-21, FIG. 19 is a functional block diagram showing a circuit structure of an output amplifier 1900 of a source driver in accordance with an embodiment of the present invention, FIG. 20 and FIG. 21 are schematic diagrams showing signal paths of the source driver 1900 in accordance with an embodiment of the present invention. The output amplifier 1900 is similar to the output amplifier 900 shown in FIG. 9, but the difference is in that the second switch circuit 915 is omitted. As shown in FIG. 20 and FIG. 21, the operation of this embodiment is similar to the embodiment shown in FIG. 17 and FIG. 18. For example, the fourth switch circuit 970 is configured to output the signal from the active load circuit 950 to the first negative output stage circuit 982 when the third switch circuit 960 is configured to output the signal from the active load circuit 940 to the first positive output stage circuit 981, and the fourth switch circuit 970 is configured to output the signal from the active load circuit 950 to the second negative output stage circuit 992 when the third switch circuit 960 is configured to output the signal from the active load circuit 940 to the second positive output stage circuit 991.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An output amplifier of a source driver, the output amplifier comprising:
   a first switch circuit configured to receive a positive reference signal and a negative reference signal of the source driver, wherein the first switch circuit has a first output terminal and a second output terminal configured to selectively output the positive reference signal and the negative reference signal;
   a first input stage circuit electrically connected to the first output terminal of the first switch circuit to receive one of the positive reference signal and the negative reference signal and to output a first received reference signal accordingly;
   a second input stage circuit electrically connected to the second output terminal of the first switch circuit to receive the other one of the positive reference signal and the negative reference signal and to output a second received reference signal accordingly;
   a first active load circuit electrically connected to the first input stage circuit to receive the first received reference signal;
   a second switch circuit electrically connected to the first active load circuit to receive the first received reference signal, wherein the second switch circuit has a first output terminal and a second output terminal, and the second switch circuit is configured to select one of the first output terminal and the second output terminal to output the first received reference signal;
   a first positive output stage circuit electrically connected to the first output terminal of the second switch circuit;
   a first negative output stage circuit electrically connected to the second output terminal of the second switch circuit;
   a second active load circuit electrically connected to the second input stage circuit to receive the second received reference signal;
   a third switch circuit electrically connected to the second active load circuit to receive the second received reference signal, wherein the third switch circuit has a first output terminal and a second output terminal, and the third switch circuit is configured to select one of the first output terminal and the second output terminal to output the second received reference signal;
   a second positive output stage circuit electrically connected to the first output terminal of the third switch circuit; and
   a second negative output stage circuit electrically connected to the second output terminal of the third switch circuit,
   wherein an output terminal of the first positive output stage circuit and an output terminal of the first negative output stage circuit are electrically connected together, and an output terminal of the second positive output stage circuit and an output terminal of the second negative output stage circuit are electrically connected together, and a power voltage source and a half-power voltage source are electrically connected to the first positive output stage and the second output stage to provide a power voltage and a ground reference voltage of the first positive output stage and the second positive output stage, and a ground voltage source and the half-power voltage source are electrically connected to the first negative output stage and the negative output stage to provide a ground reference voltage and a power voltage of the first negative output stage and the second negative output stage, and a value of the voltage of the half-power voltage source is between a value of the voltage of the power voltage source and a value of the voltage of the ground voltage source.

2. The output amplifier as claimed in claim 1, wherein each of the first positive output stage circuit, the second positive output stage circuit, the first negative output stage circuit and the second negative output stage circuit comprises:
a complementary transistor pair comprising an N-type field-effect transistor and a P-type field-effect transistor.

3. The output amplifier as claimed in claim 2, further comprises:
a first bulk switch circuit configured to electrically connect one of the power voltage source and the half-power voltage source with a bulk of the P-type field-effect transistor of the first negative output stage circuit;
a second bulk switch circuit configured to electrically connect one of the ground voltage source and the half-power voltage source with a bulk of the N-type field-effect transistor of the first positive output stage circuit;
a third bulk switch circuit configured to electrically connect one of the power voltage source and the half-power voltage source with a bulk of the P-type field-effect transistor of the second negative output stage circuit; and
a fourth bulk switch circuit configured to electrically connect one of the ground voltage source and the half-power voltage source with a bulk of the N-type field-effect transistor of the second positive output stage circuit.

4. The output amplifier as claimed in claim 3, further comprises:
a first pull high circuit configured to pull a voltage level at a gate of the P-type field-effect transistor of the first negative output stage circuit to the voltage level of the half-power voltage source;
a second pull high circuit configured to pull a voltage level at a gate of the P-type field-effect transistor of the first positive output stage circuit to the voltage level of the power voltage source;
a third pull high circuit configured to pull a voltage level at a gate of the P-type field-effect transistor of the second negative output stage circuit to the voltage level of the half-power voltage source;
a fourth pull high circuit configured to pull a voltage level at a gate of the P-type field-effect transistor of the second positive output stage circuit to the voltage level of the power voltage source;
a first pull low circuit configured to pull a voltage level at a gate of the N-type field-effect transistor of the first negative output stage circuit to the voltage level of the ground voltage source;
a second pull low circuit configured to pull a voltage level at a gate of the N-type field-effect transistor of the first positive output stage circuit to the voltage level of the half-power voltage source;
a third pull low circuit configured to pull a voltage level at a gate of the N-type field-effect transistor of the second negative output stage circuit to the voltage level of the ground voltage source; and
a fourth pull low circuit configured to pull a voltage level at a gate of the N-type field-effect transistor of the second positive output stage circuit to the voltage level of the half-power voltage source.

5. The output amplifier as claimed in claim 4, wherein:
the first pull high circuit comprises:
a first pull high transistor having an input terminal and an output terminal, wherein the output terminal of the first pull high transistor is electrically connected to the gate of the P-type field-effect transistor of the first negative output stage circuit; and
a first gate switch circuit configured to electrically connect one of the power voltage source and the half-power voltage source with the input terminal of the first pull high transistor, wherein the first gate switch circuit electrically connects the power voltage source with the input terminal of the first pull high transistor when the first pull high transistor is turned off;
the second pull low circuit comprises:
a first pull low transistor having an input terminal and an output terminal, wherein the output terminal of the first pull low transistor is electrically connected to the gate of the N-type field-effect transistor of the first positive output stage circuit; and
a second gate switch circuit configured to electrically connect one of the ground voltage source and the half-power voltage source with the input terminal of the first pull low transistor, wherein the second gate switch circuit electrically connects the ground voltage source with the input terminal of the first pull low transistor when the first pull low transistor is turned off.

6. The output amplifier as claimed in claim 5, wherein:
the third pull high circuit comprises:
a second pull high transistor having an input terminal and an output terminal, wherein the output terminal of the second pull high transistor is electrically connected to the gate of the P-type field-effect transistor of the second negative output stage circuit; and
a third gate switch circuit configured to electrically connect one of the power voltage source and the half-power voltage source with the input terminal of the second pull high transistor, wherein the third gate switch circuit electrically connects the power voltage source with the input terminal of the second pull high transistor when the pull high transistor is turned off;
the fourth pull low circuit comprises:
a second pull low transistor having an input terminal and an output terminal, wherein the output terminal of the second pull low transistor is electrically connected to the gate of the N-type field-effect transistor of the second positive output stage circuit; and
a fourth gate switch circuit configured to electrically connect one of the ground voltage source and the half-power voltage source with the input terminal of the second pull low transistor, wherein the fourth gate switch circuit electrically connects the ground voltage source with the input terminal of the pull low transistor when the second pull low transistor is turned off.

7. The output amplifier as claimed in claim 1, wherein the first active load circuit and the second active load circuit have current mirror circuits.

8. The output amplifier as claimed in claim 1, wherein the value of the voltage of the half-power voltage source is substantially equal to a half of a difference between the value of the voltage of the power voltage source and the value of the voltage of the ground voltage source.

9. An output amplifier of a source driver, the output amplifier comprising:
- a first switch circuit configured to receive a positive reference signal and a negative reference signal of the source driver, wherein the first switch circuit has a first output terminal and a second output terminal configured to selectively output the positive reference signal and the negative reference signal;
- a first input stage circuit electrically connected to the first output terminal of the first switch circuit to receive one of the positive reference signal and the negative reference signal and to output a first received reference signal accordingly;
- a second input stage circuit electrically connected to the second output terminal of the first switch circuit to receive the other one of the positive reference signal and the negative reference signal and to output a second received reference signal accordingly;
- a first active load circuit configured to receive one of the first received reference signal and the second received reference signal;
- a second active load circuit configured to receive the other one of the first received reference signal and the second received reference signal;
- a third switch circuit electrically connected to the first active load circuit, wherein the third switch circuit has a first output terminal and a second output terminal, and the third switch circuit is configured to select one of the first output terminal and the second output terminal to output one of the first received reference signal and the second received reference signal;
- a fourth switch circuit electrically connected to the second active load circuit, wherein the fourth switch circuit has a first output terminal and a second output terminal, and the fourth switch circuit is configured to select one of the first output terminal and the second output terminal to output the other one of the first received reference signal and the second received reference signal;
- a first positive output stage circuit electrically connected to the first output terminal of the third switch circuit;
- a second positive output stage circuit electrically connected to the second output terminal of the third switch circuit;
- a first negative output stage circuit electrically connected to the first output terminal of the fourth switch circuit; and
- a second negative output stage circuit electrically connected to the second output terminal of the fourth switch circuit;
- wherein an output terminal of the first positive output stage circuit and an output terminal of the first negative output stage circuit are electrically connected together, and an output terminal of the second positive output stage circuit and an output terminal of the second negative output stage circuit are electrically connected together, and a power voltage source and a half-power voltage source are electrically connected to the first positive output stage and the second output stage to provide a power voltage and a ground reference voltage of the first positive output stage and the second positive output stage, and a ground voltage source and the half-power voltage source are electrically connected to the first negative output stage and the negative output stage to provide a ground reference voltage and a power voltage of the first negative output stage and the second negative output stage, and a value of the voltage of the half-power voltage source is between a value of the voltage of the power voltage source and a value of the voltage of the ground voltage source.

10. The output amplifier as claimed in claim 9, further comprising a second switch circuit having a first output terminal and a second output terminal, wherein the second switch circuit is electrically connected to the first input stage circuit and the second input stage circuit to receive the first received reference signal and the second received reference signal, and the first output terminal and the second switch circuit of the second switch circuit are configured to selectively output the first received reference signal and the second received reference signal to the first active load circuit and the second active load circuit.

11. The output amplifier as claimed in claim 10, further comprises:
- a first bulk switch circuit configured to electrically connect one of the ground voltage source and the half-power voltage source with a bulk of the N-type field-effect transistor of the first positive output stage circuit;
- a second bulk switch circuit configured to electrically connect one of the ground voltage source and the half-power voltage source with a bulk of the N-type field-effect transistor of the second positive output stage circuit;
- a third bulk switch circuit configured to electrically connect one of the power voltage source and the half-power voltage source with a bulk of the P-type field-effect transistor of the first negative output stage circuit; and
- a fourth bulk switch circuit configured to electrically connect one of the power voltage source and the half-power voltage source with a bulk of the P-type field-effect transistor of the second negative output stage circuit.

12. The output amplifier as claimed in claim 11, further comprises:
- a first pull high circuit configured to pull a voltage level at a gate of the P-type field-effect transistor of the first positive output stage circuit to the voltage level of the power voltage source;
- a second pull high circuit configured to pull a voltage level at a gate of the P-type field-effect transistor of the second positive output stage circuit to the voltage level of the power voltage source;
- a third pull high circuit configured to pull a voltage level at a gate of the P-type field-effect transistor of the first negative output stage circuit to the voltage level of the half-power voltage source;
- a fourth pull high circuit configured to pull a voltage level at a gate of the P-type field-effect transistor of the second negative output stage circuit to the voltage level of the half-power voltage source;
- a first pull low circuit configured to pull a voltage level at a gate of the N-type field-effect transistor of the first positive output stage circuit to the voltage level of the half-power voltage source;
- a second pull low circuit configured to pull a voltage level at a gate of the N-type field-effect transistor of the second positive output stage circuit to the voltage level of the half-power voltage source;
- a third pull low circuit configured to pull a voltage level at a gate of the N-type field-effect transistor of the first negative output stage circuit to the voltage level of the ground voltage source; and a fourth pull low circuit configured to pull a voltage level at a gate of the N-type field-effect transistor of the second negative output stage circuit to the voltage level of the ground voltage source.

13. The output amplifier as claimed in claim 12, wherein: the first pull low circuit comprises:
    a first pull low transistor having an input terminal and an output terminal, wherein the output terminal of the first pull low transistor is electrically connected to the gate of the N-type field-effect transistor of the first positive output stage circuit; and
    a first gate switch circuit configured to electrically connect one of the ground voltage source and the half-power voltage source with the input terminal of the first pull low transistor, wherein the first gate switch circuit electrically connects the ground voltage source with the input terminal of the first pull low transistor when the first pull low transistor is turned off;
    the second pull low circuit comprises:
    a second pull low transistor having an input terminal and an output terminal, wherein the output terminal of the second pull low transistor is electrically connected to the gate of the N-type field-effect transistor of the second positive output stage circuit; and
    a second gate switch circuit configured to electrically connect one of the ground voltage source and the half-power voltage source with the input terminal of the second pull low transistor, wherein the second gate switch circuit electrically connects the ground voltage source with the input terminal of the second pull low transistor when the second pull low transistor is turned off.

14. The output amplifier as claimed in claim 13, wherein: the third pull high circuit comprises:
    a first pull high transistor having an input terminal and an output terminal, wherein the output terminal of the first pull high transistor is electrically connected to the gate of the P-type field-effect transistor of the first negative output stage circuit; and
    a third gate switch circuit configured to electrically connect one of the power voltage source and the half-power voltage source with the input terminal of the first pull high transistor, wherein the third gate switch circuit electrically connects the power voltage source with the input terminal of the first pull high transistor when the first pull high transistor is turned off;
    the fourth pull high circuit comprises:
    a second pull high transistor having an input terminal and an output terminal, wherein the output terminal of the second pull high transistor is electrically connected to the gate of the P-type field-effect transistor of the second negative output stage circuit; and
    a fourth gate switch circuit configured to electrically connect one of the power voltage source and the half-power voltage source with the input terminal of the second pull high transistor, wherein the fourth gate switch circuit electrically connects the power voltage source with the input terminal of the second pull high transistor when the second pull high transistor is turned off.

15. The output amplifier as claimed in claim 9, wherein the first active load circuit and the second active load circuit have current mirror circuits.

16. The output amplifier as claimed in claim 9, wherein the value of the voltage of the half-power voltage source is substantially equal to a half of a difference between the value of the voltage of the power voltage source and the value of the voltage of the ground voltage source.

17. A control method of an output amplifier of a source driver, comprising:
    providing a first switch circuit, a second switch circuit, a third switch circuit, a first input stage circuit, a second input stage circuit, a first active load circuit, a second active load circuit, a first positive output stage circuit, a first negative output stage circuit, a second positive output stage circuit and a second negative output stage circuit, wherein the first switch circuit receives a positive reference signal and a negative reference signal of the source driver;
    performing a first display stage comprising:
        setting the first switch circuit to output the positive reference signal through a first output terminal and to output the negative reference signal through a second output terminal;
        receiving the positive reference signal and the negative reference signal respectively to obtain a first received reference signal and a second received reference signal by using the first input stage circuit and the second input stage circuit;
        receiving the first received reference signal and the second received reference signal respectively by using the first active load circuit and the second active load circuit; and
        setting the second switch circuit and the third switch circuit to respectively receive the first received reference signal and the second received reference signal and to selectively output the received reference signal and the second received reference signal to the first positive output stage circuit, the first negative output stage circuit, the second positive output stage circuit and the second negative output stage circuit; and
    performing a second display stage wherein the second display stage comprises:
        switching the first switch circuit to output the positive reference signal through the second output terminal and to output the negative reference signal through the first output terminal;
        receiving the positive reference signal and the negative reference signal respectively to obtain a first received reference signal and a second received reference signal by using the first input stage circuit and the second input stage circuit;
        receiving the first received reference signal and the second received reference signal respectively by using the first active load circuit and the second active load circuit; and
        switching the second switch circuit and the third switch circuit to respectively receive the first received reference signal and the second received reference signal and to selectively output the received reference signal and the second received reference signal to the first positive output stage circuit, the first negative output stage circuit, the second positive output stage circuit and the second negative output stage circuit.

18. The control method as claimed in claim 17, wherein: in the first display stage, the second switch circuit outputs the first received reference signal to the first positive stage circuit, and the third switch circuit outputs the second received reference signal to the second negative output stage circuit; and in the second display stage, the second switch circuit is switched to output the first received reference signal to the first negative stage circuit, and the third switch circuit is switched to output the second received reference signal to the second positive output stage circuit.

19. The control method as claimed in claim 17, wherein:
the first display stage further comprises:
  receiving the received reference signal and the second received reference signal from the first input stage circuit and the second input stage circuit by using a fourth switch circuit; and
outputting the first received reference signal to the first active load circuit and outputs the second received reference signal to the second active load circuit by using the fourth switch circuit; and the second display stage further comprises:
  switching the fourth switch circuit to output the first received reference signal to the second active load circuit and outputs the second received reference signal to the first active load circuit.

20. The control method as claimed in claim 19, wherein:
in the first display stage, the second switch circuit outputs the first received reference signal to the first positive stage circuit, and the third switch circuit outputs the second received reference signal to the second negative output stage circuit; and in the second display stage, the second switch circuit is switched to output the first received reference signal to the second positive stage circuit, and the third switch circuit is switched to output the second received reference signal to the first negative output stage circuit.

* * * * *